US012724087B2

(12) United States Patent
Gutknecht et al.

(10) Patent No.: US 12,724,087 B2
(45) Date of Patent: Sep. 1, 2026

(54) SYSTEMS AND METHODS FOR MANAGEMENT OF AN ENERGY UNIT

(71) Applicant: Instagrid GmbH, Ludwigsburg (DE)

(72) Inventors: Philipp Gutknecht, Ludwigsburg (DE); Julian Dessecker, Ludwigsburg (DE); Raphael Zürner, Ludwigsburg (DE); Sebastian Berning, Ludwigsburg (DE)

(73) Assignee: Instagrid GmbH, Ludwigsburg (DE)

( * ) Notice: Subject to any disclaimer, the term of this patent is extended or adjusted under 35 U.S.C. 154(b) by 0 days.

(21) Appl. No.: 19/547,884

(22) Filed: Feb. 24, 2026

(65) Prior Publication Data

US 2026/0186071 A1 Jul. 2, 2026

Related U.S. Application Data

(63) Continuation of application No. PCT/EP2025/055967, filed on Mar. 5, 2025.

(30) Foreign Application Priority Data

Apr. 11, 2024 (EP) .................................... 24169633

(51) Int. Cl.
*G01R 31/396* (2019.01)
*H02J 7/80* (2026.01)

(52) U.S. Cl.
CPC .............. *G01R 31/396* (2019.01); *H02J 7/80* (2026.01)

(58) Field of Classification Search
CPC ................................ G01R 31/396; H02J 7/80
See application file for complete search history.

(56) References Cited

U.S. PATENT DOCUMENTS 6,606,678 B1 * 8/2003 Nakamura .......... G06F 13/4059 710/305
8,824,570 B2 * 9/2014 Pischl ................ H04L 25/0276 375/257

(Continued)

OTHER PUBLICATIONS

International Search Report for PCT/EP2025/055967 dated May 21, 2025.

(Continued)

*Primary Examiner* — Kabir A Timory
(74) *Attorney, Agent, or Firm* — Fox Rothschild LLP

(57) ABSTRACT

Systems, methods and software products comprising: providing cell measurement signals (CMs) associated with electrical energy storage component stack (CMs are referenced to ground potential (GP) at a local ground terminal (LGT)); providing via a first interface (FI) CM(s) as a first differential cell data signal (FDCDS) (wherein FI comprises differential terminals (DTs); providing FDCDS at a first winding (FW) of a first transformer (FT) connected to FI; establishing a coupling between GP and each terminal of FW via a bypass capacitor (BC) disposed between a DT and LGT; and referencing a center tap (CT) located between FT's winding terminals to LGT to establish a low-impedance coupling between CT and LGT, and isolate DC potential at LGT from DC potential of DTs. The low-impedance coupling is such that it reduces parasitic voltage drop at CT caused by high-frequency common-mode noise current due to noise signal transferred via parasitic capacitive coupling between FT's windings.

19 Claims, 23 Drawing Sheets

(56) References Cited

U.S. PATENT DOCUMENTS

| | | | | |
|---|---|---|---|---|
| 2013/0187610 | A1* | 7/2013 | Hayashi | H02J 7/82 320/118 |
| 2018/0254931 | A1* | 9/2018 | Gardner | H04B 3/30 |
| 2020/0313934 | A1* | 10/2020 | Shuvalov | H04L 25/0266 |

OTHER PUBLICATIONS

Linear Technology LTC6804-1/LTC6804-2, Multicell Battery Monitors, 2013.
Battery Management System (BMS), NXP Semiconductors.
Linear Technology, Demo Manual DC1941D, LTC6820 isoSPI 2-Wire Serial Interface, 2013.
Analog Devices, LTC6811-1/LTC6811-2, 12-Cell Battery Stack Monitors, Nov. 2019.
Analog Devices, LTC6820, isoSPI Isolated Communications Interface, May 2019.
Zhang, Bruce, Renesas Fourth Generation New BMS Solution Won China's Top-10 Power Product Breakthrough Award in 2020, Renesas Electronics Corporation, Oct. 30, 2020.
Seshan, Neel et al., Simplify current and voltage monitoring with isolated SPI and I2C in your battery management systems (BMS), Texas Instruments, Incorporated, Jul. 2018.

* cited by examiner

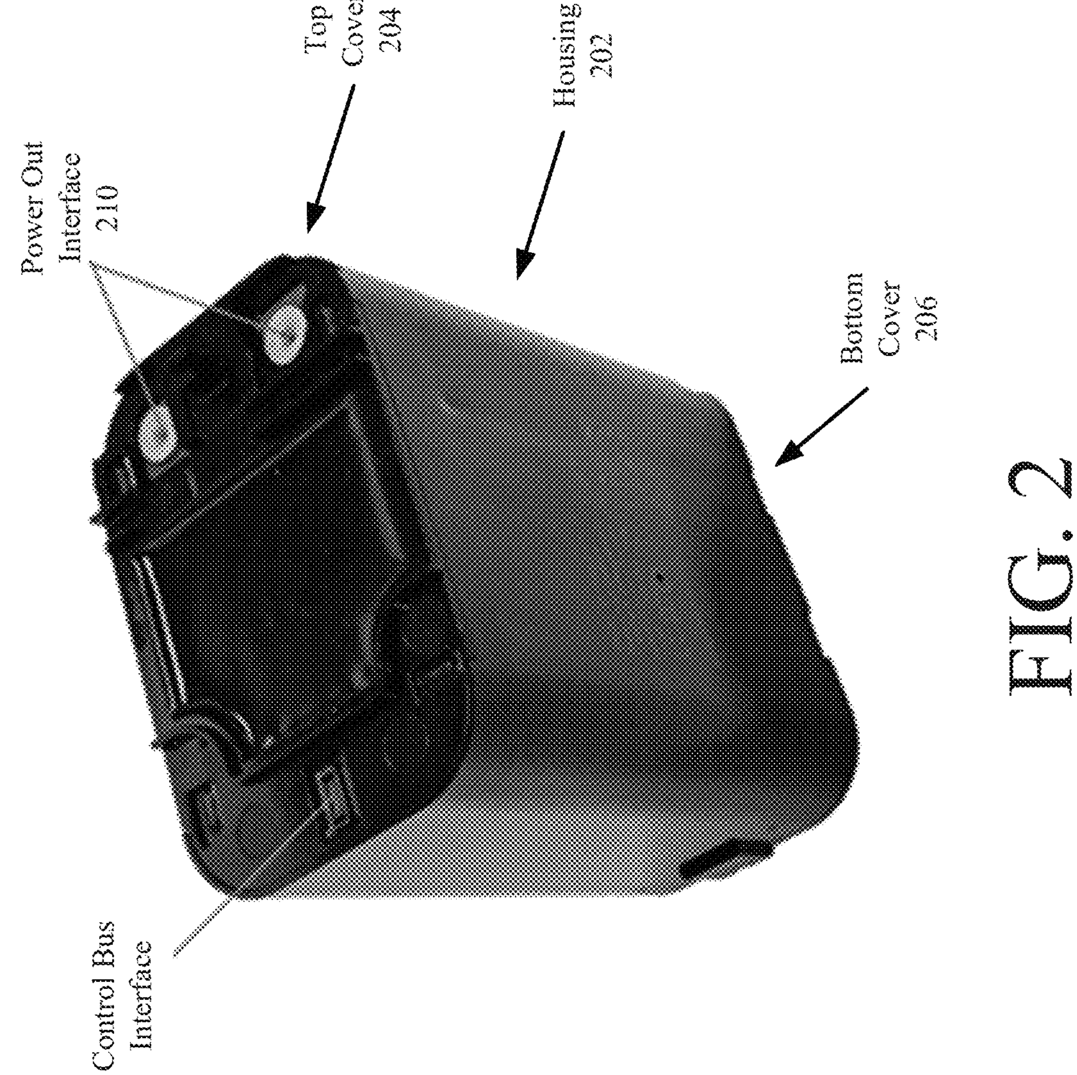
FIG. 2

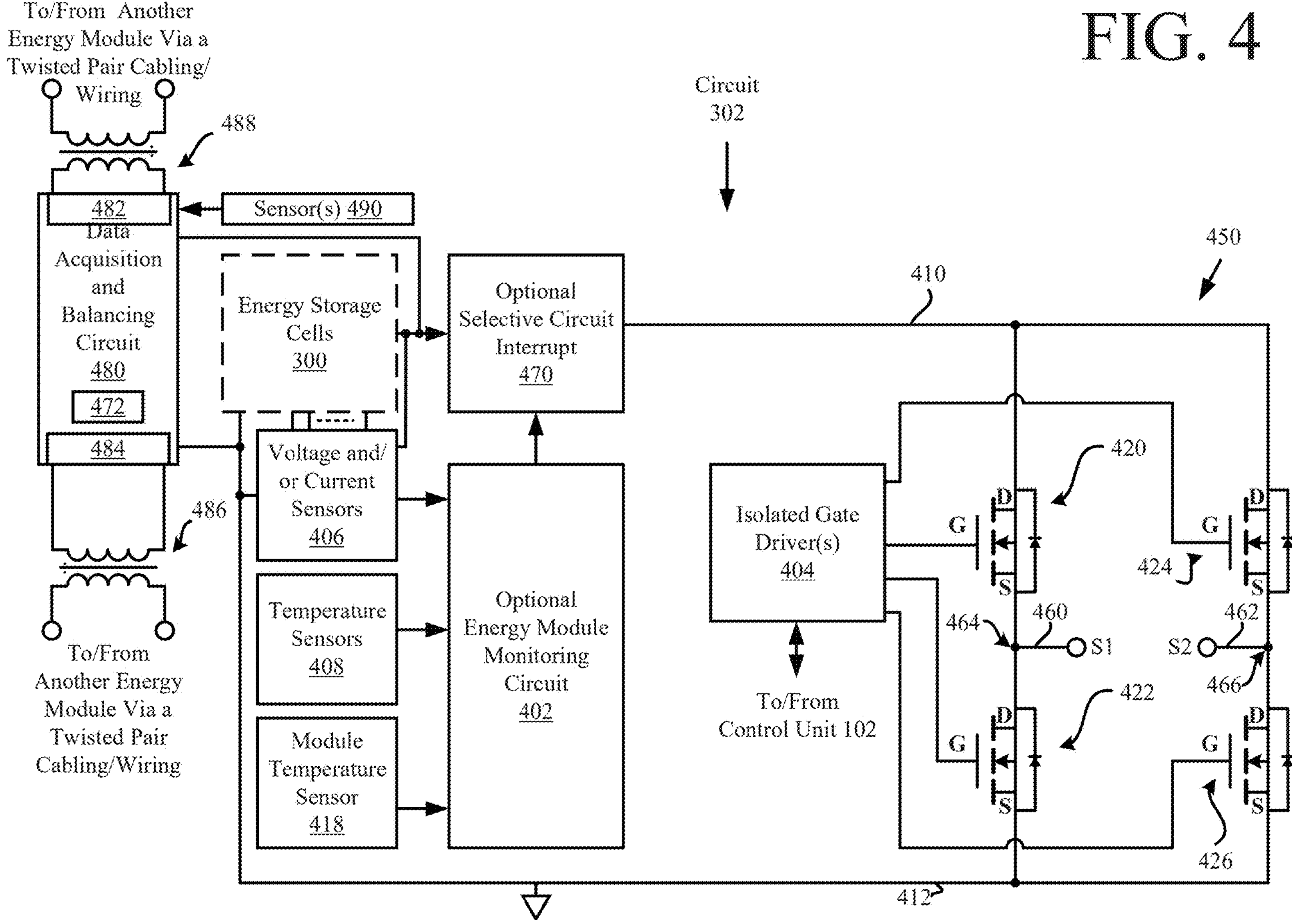
FIG. 4
To/From Another Energy Module Via a Twisted Pair Cabling/Wiring
488
482
Data Acquisition and Balancing Circuit 480
472
484
486
To/From Another Energy Module Via a Twisted Pair Cabling/Wiring
Sensor(s) 490
Energy Storage Cells 300
Voltage and/or Current Sensors 406
Temperature Sensors 408
Module Temperature Sensor 418
Circuit 302
Optional Selective Circuit Interrupt 470
Optional Energy Module Monitoring Circuit 402
410
450
Isolated Gate Driver(s) 404
To/From Control Unit 102
420
422
424
426
G
D
S
460
462
464
466
S1
S2
412

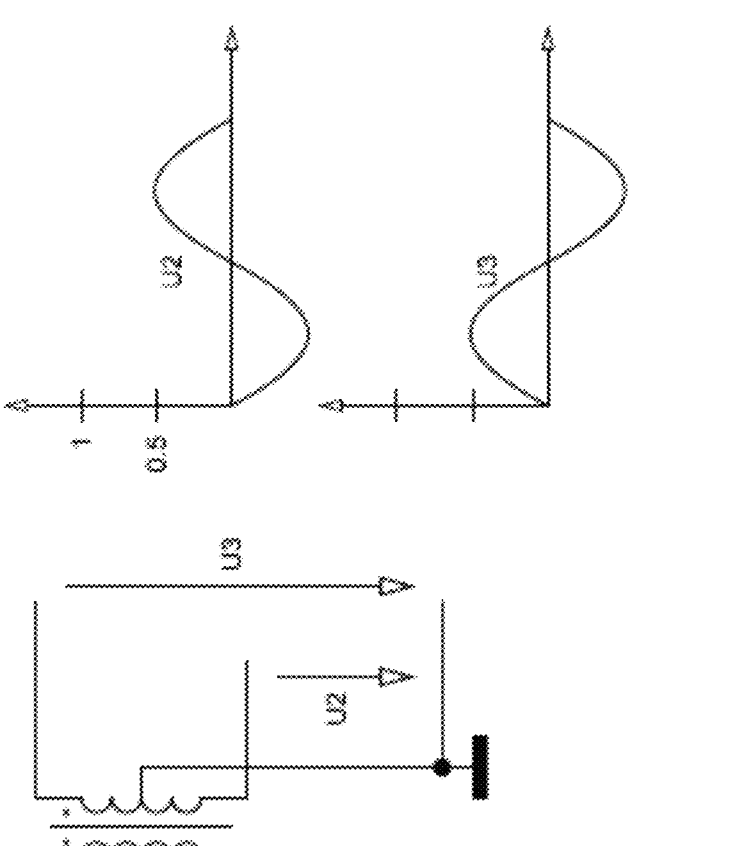
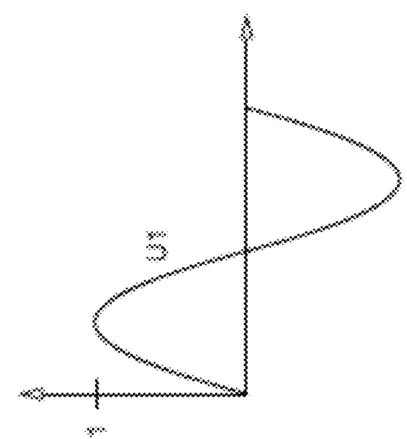
FIG. 14

SYSTEMS AND METHODS FOR MANAGEMENT OF AN ENERGY UNIT

CROSS-REFERENCE TO RELATED APPLICATION

The present application is a bypass continuation of International PCT Patent Application No. PCT/EP2025/055967 which was filed on Mar. 5, 2025, and claims priority to and the benefit of European Patent Application No. 24169633.5, filed on Apr. 11, 2024, the content of the listed Patent Applications are incorporated herein by reference in their entireties.

BACKGROUND

Description of the Related Art

A power supply may comprise a plurality of battery modules and a controller for controlling operations thereof. The controller may be configured to selectively activate and deactivate the battery modules for causing the power supply to deliver AC power to the load with the correct voltage, current and frequency.

SUMMARY

The present disclosure concerns implementing systems and methods for transmitting cell data of an electrical energy storage component stack comprising a local ground terminal. The methods may comprise: providing, via a plurality of sense terminals, a plurality of cell measurement signals associated with the electrical energy storage component stack (e.g., wherein the plurality of cell measurement signals are referenced to a ground potential at a local ground terminal); providing via a first interface at least some of the plurality of cell measurement signals as a first differential cell data signal (e.g., wherein the first interface is in a transmit state and comprises differential terminals); providing the first differential cell data signal at a first winding of a first transformer connected to the first interface; establishing a coupling between the ground potential and each winding terminal of the first winding via a bypass capacitor disposed between a respective one of the differential terminals and the local ground terminal; and referencing a center tap located between the winding terminals of the first transformer to the local ground terminal so as to: establish a low-impedance coupling between the center tap and the local ground terminal, and isolate DC potential at the local ground terminal from DC potential of the differential terminals. The low-impedance coupling is such that it reduces parasitic voltage drop at the center tap caused by high-frequency common-mode noise current due to a noise signal transferred via parasitic capacitive coupling between windings of the first transformer, thereby reducing interference caused by the noise signal in the first differential cell data signal.

In those or non-limiting embodiments, at least some of the high-frequency common-mode noise is caused by switching elements. The switching elements may be part of a transistor active bridge circuit. The active bridge circuit may be an H-bridge circuit, such as an H-bridge inverter. In those or other non-limiting embodiments, multiple such active bridge circuits, such as H-bridge circuits, may be provided. Accordingly, at least some of the high-frequency common-mode noise may be caused by multiple active bridge circuits, e.g., series connected energy storage modules or energy modules.

In some cases, at least some of the high-frequency common-mode noise may couple through from one energy storage module to another energy storage module, e.g., an adjacently connected energy storage module. In those or other non-limiting embodiments, the present teachings can be especially relevant for battery management systems (BMS) and their applications, particularly when the energy stack comprises switching elements, e.g., those used for switching electrical power.

The present disclosure concerns implementing systems, methods and software products for receiving cell data of an electrical energy storage component stack comprising a local ground terminal. The methods may comprise: providing a first differential cell data signal at a first winding of a first transformer connected to a first interface; providing the first differential cell data signal to the first interface (e.g., wherein the first interface is in a receive state and comprises differential terminals); establishing a coupling between a ground potential and each winding terminal of the first winding via a bypass capacitor disposed between a respective one of the differential terminals and a local ground terminal; and referencing a center tap located between the winding terminals of the first transformer to the local ground terminal so as to establish a low-impedance coupling between the center tap and the local ground terminal, and isolating DC potential at the local ground terminal from DC potential of the differential terminals. The low-impedance coupling is such that it reduces parasitic voltage drop at the center tap caused by high-frequency common-mode noise current due to a noise signal transferred via parasitic capacitive coupling between windings of the first transformer, thereby reducing interference caused by the noise signal in the differential cell data signal.

BRIEF DESCRIPTION OF THE DRAWINGS

The present solution will be described with reference to the following drawing figures, in which like numerals represent like items throughout the figures.

FIG. 2 provides a perspective view of an energy storage module of the power unit shown in FIG. 1.

FIG. 4 provides an illustrative block diagram of a circuit in the energy storage module shown in FIGS. 2-3.

DETAILED DESCRIPTION

The present solution is described with reference to the attached figures. The figures are not drawn to scale and they are provided merely to illustrate the instant solution. Several aspects of the present solution are described below with reference to example applications for illustration. It should be understood that numerous specific details, relationships, and methods are set forth to provide a full understanding of the present solution. One having ordinary skill in the relevant art, however, will readily recognize that the present solution can be practiced without one or more of the specific details or with other methods. In other instances, well-known structures or operations are not shown in detail to avoid obscuring the present solution. The present solution is not limited by the illustrated ordering of acts or events, as some acts may occur in different orders and/or concurrently with other acts or events. Furthermore, not all illustrated acts or events are required to implement a methodology in accordance with the present solution.

It should also be appreciated that the terminology used herein is for the purpose of describing particular embodiments only and is not intended to be limiting of the present solution. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Further, unless otherwise defined, all terms (including technical and scientific terms) used herein have the same meaning as commonly understood by one of ordinary skill in the art to which this solution belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As noted above, a power supply may comprise battery modules and a controller for controlling operations thereof. The controller may be configured to selectively activate and deactivate the battery modules for causing the power supply to deliver AC power to the load with the correct voltage, current and frequency. The present solution is directed to a novel technique for communicatively coupling the battery modules to the controller in a daisy-chain arrangement. In those or other non-limiting embodiments, at least some of the battery modules comprise power switching elements, e.g., part of active bridge such as an H-bridge.

Figure 1:
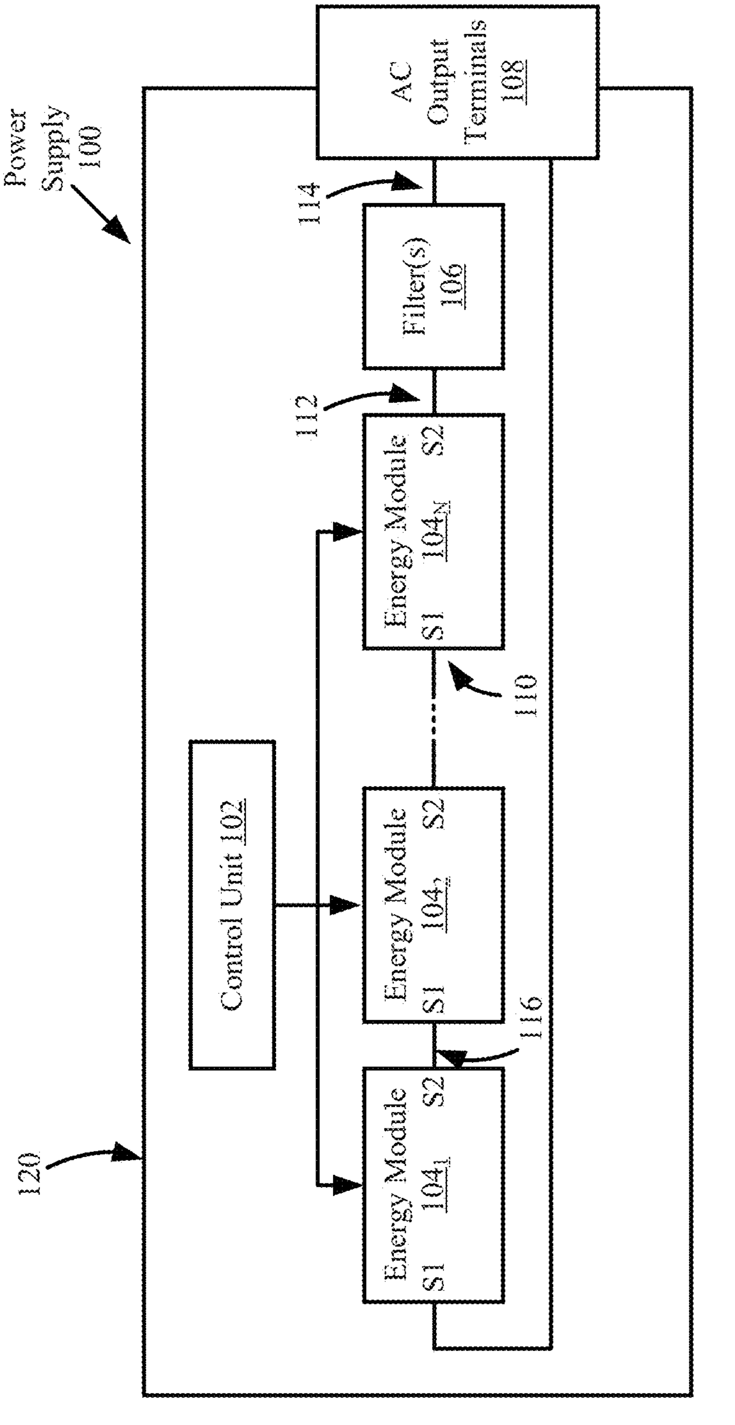
FIG. 1 provides an illustrative block diagram of a power unit.

FIG. 1 provides an illustration of a power supply 100 which may be portable or otherwise mobile. The power supply 100 may have a size and weight to allow a single individual to carry the same with relative ease and/or to allow the same to be carried in a backpack or other bag. Power supply 100 may be connected in series or parallel with other power supplies to form a power supply unit.

Power supply 100 is generally configured to supply electric power to a load (not shown in FIG. 1). The load can include any electronic device that needs to be supplied power. Such loads can include, but are not limited to, another power supply, communication devices, media devices, golf carts, electric appliances, computing devices, and/or professional or home energy storage systems.

As shown in FIG. 1, the power supply 100 comprises a housing 120 in which a plurality of energy storage modules $\mathbf{104}_1$, $\mathbf{104}_2$, . . . , $\mathbf{104}_N$ (collectively referred to as "energy storage modules 104") are housed. N is an integer equal to or greater than one. Each of the energy storage modules 104 is generally configured to convert direct current (DC) outputs from internal electrical energy storage cells into an alternating current (AC) output of the energy storage module. The electrical energy storage cells can include, but are not limited to, battery cells and/or super capacitors. The energy storage modules 104 are electrically connected to each other via insulated wires 116. In this way, the AC outputs of the energy storage modules are combined or otherwise summed together to produce the AC output power of the power supply 100. More specifically, the energy storage modules 104 are connected in series in a controllable manner to supply different voltages at the output of the power supply 100. AC output terminals 108 provide a means to connect the output of the power supply 100 to the load.

In some uses, more than one instance of the power supply 100 may be coupled together to obtain a larger capacity power supply and/or a multi-voltage power supply. Such plurality of instances of the power supply 100 may, for example, be enclosed in a common housing (not shown in FIG. 1). It is further possible to obtain multi-phase power supplies using multiple instances of the power supply 100. It shall be appreciated that such arrangements may further benefit from a reliable thermal monitoring of the electrical energy storage cells which are packed together.

Operation of the energy storage modules 104 may be controlled by a control unit 102. Control unit 102 may reside external to the power supply 100 in some scenarios in which the power supply 100 comprises part of a grid. The grid can include a plurality of power supplies that are connected to each other and controlled by a grid controller. Control unit 102 is shown internal to the power supply 100 for ease of illustration and explanation of the system operations. However, the present solution is not limited to the shown configuration.

Control unit 102 is configured to selectively activate and deactivate the energy storage modules 104 for causing the power supply 100 to deliver AC power to the load with the correct voltage, current and frequency. The control unit 102 is connected to each of the energy storage modules $\mathbf{104}_1$, $\mathbf{104}_2$, . . . , $\mathbf{104}_N$ so that the energy storage modules can be controlled individually thereby. The control unit 102 is configured to selectively transition each energy storage module between a battery mode and a bypass mode. When an energy storage module is in its battery mode, the internal electrical energy storage cells are switched into the circuit such that they are connected between terminals 110, 112 thereof. As such, a voltage output from the electrical energy storage cells is provided at terminal 110 and 112. In contrast, when the energy storage module is in a bypass mode, the internal electrical energy storage cells are bypassed such the terminals 110, 112 are directly shortened to each other. In effect, no voltage from the electrical energy storage cells is provided at terminal 110 or 112 of the energy storage module.

Particularly, an energy storage module may provide the following operation modes: a Hi-Z (high impedance) mode in which module output is set to a high-impedance state (e.g., associated with none of the switches in the module being turned ON); a bypass mode in which the energy storage module is not contributing any battery voltage, but letting the current flow via it (e.g., via both low-side switches of the H-bridge being turned ON); a conducting+ mode in which the electrical energy storage cells are connected to the module output in a given polarity; and a conducting−mode in which the electrical energy storage cells are connected to the module output in an opposite polarity as compared to the conducting+mode.

By successively transitioning the energy storage modules from the bypass mode to the battery mode, the combined output voltage of the energy storage modules 104 can be increased in steps. Similarly, by successively transitioning the energy storage modules from the battery mode to the bypass mode, the combined output voltage of the energy storage modules 104 can be decreased in steps. The combined output voltage can be changed by an amount equal to the output voltage $V_M$ of one energy storage module. Thus, the combined output voltage $V_C$ can vary between zero volts and X times $V_M$ Volts (i.e., 0 Volts$<V_C<X \cdot V_M$ Volts). For obtaining finer transition between the $V_M$ steps, at least one energy storage module can be operated in a pulse-width-modulation (PWM) mode with time varying duty-cycle. The combined output voltage $V_C$ can be smoothed by filter 106 so as to produce a voltage signal at AC output terminals 108. The voltage signal at AC output terminals 108 may have sinusoidal characteristics, DC signal characteristics or other waveform characteristics.

FIG. 2 provides an illustration of an energy storage module $104_1$. An assembly view of the energy storage module $104_1$ is provided in FIG. 3. Energy storage modules $104_2$, . . . , $104_N$ of FIG. 1 may be the same as or similar to the energy storage module shown in FIG. 2.

Figure 3:
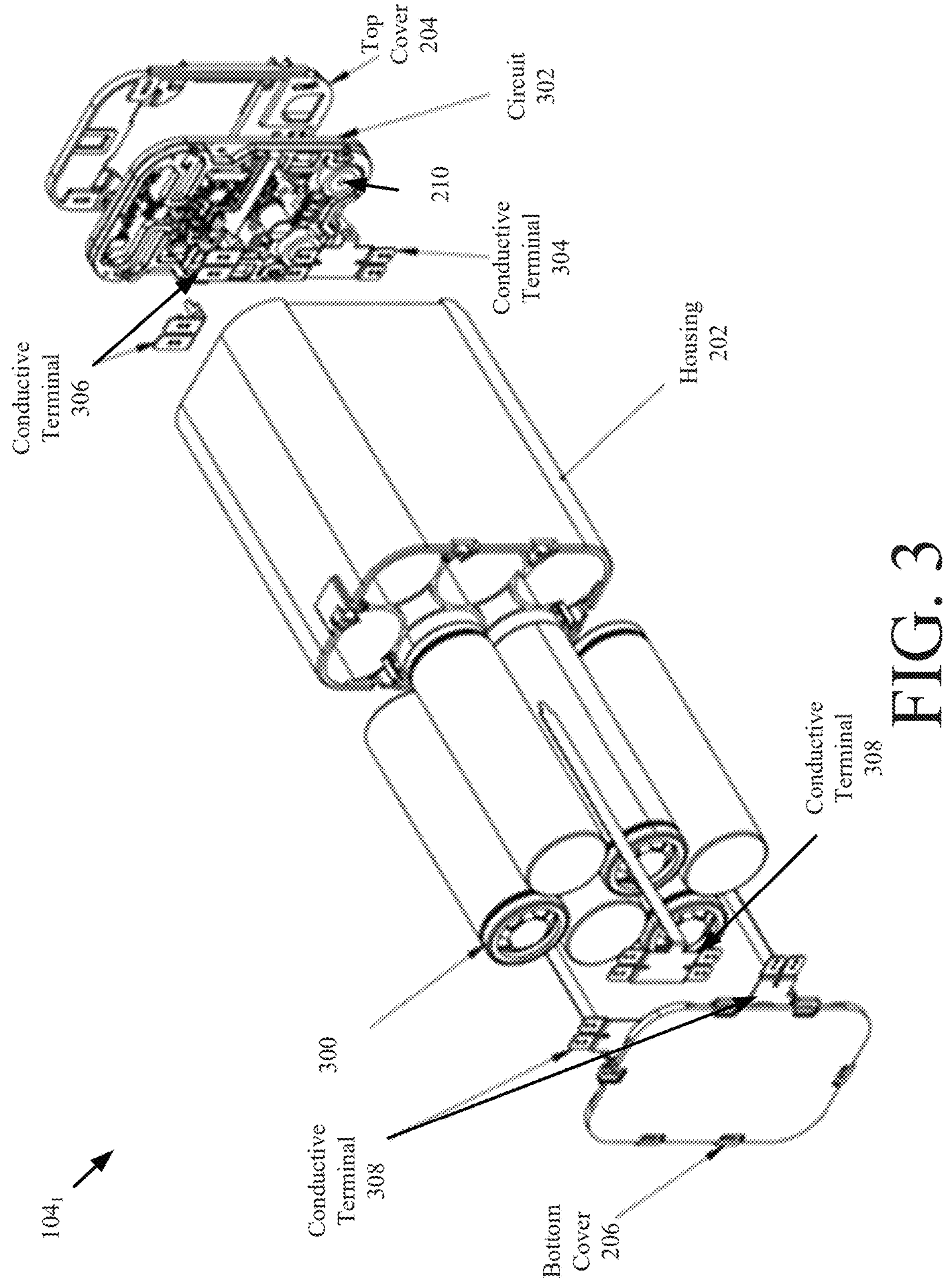
FIG. 3 provides an assembly view of the energy storage module shown in FIG. 2.

Energy storage module $104_1$ comprises a housing 202 in which electrical energy storage cells 300 are housed so as to maintain certain positions relative to each other. The electrical energy storage cells 300 can be arranged in two rows of three cells as shown in FIG. 3. The present solution is not limited in this regard. The electrical energy storage cells can have a different arrangement than that shown in FIG. 3. Any number of electrical energy storage cells can be provided in the energy storage module in accordance with a given application. Each electrical energy storage cell may include, but is not limited to, a lithium-ion cell. Hence, the energy storage module $104_1$ may comprise electrical energy storage cells which are in the form of an electrical battery, capacitor or supercapacitor, their likes or their combinations. The electrical energy storage cell, or lithium-ion cell, may have a cylindrical shape as shown or another shape (e.g., a rectangular shape) not shown.

A top cover 204 and a bottom cover 206 are provided for the housing 202. The covers 204, 206 may be configured to provide an environment seal with the housing 202. The environmental seal may be facilitated by gaskets (not visible or shown in FIGS. 2-3) compressed between the covers 204, 206 and the housing's sidewalls.

The safe and reliable operation of the energy storage module $104_1$ may require a constant monitoring of each electrical energy storage cell 300 to detect when its current, voltage and/or temperature fall outside of defined operating range(s). This monitoring may be achieved using a circuit 302 that is also housed in the housing 202. Conductive terminals 304, 306, 308 are provided to connect the electrical energy storage cells 300 to the circuit 302 for at least voltage measurements. A block diagram of circuit 302 is provided in FIG. 4.

In the example shown in FIG. 4, circuit 302 comprises voltage and current sensors 406 connected to the electrical energy storage cells 300. These sensors 406 are configured to measure the voltage and/or current of each electrical energy storage cell. Circuit 302 also comprises temperature sensors 408, a module temperature sensor 418, and sensor(s) 490. Sensor(s) 490 may include sensor(s) 406, 408, 418 and/or other sensor(s). Current sensing may be optional.

Each temperature sensor 408 is configured to measure a temperature of one or more electrical energy storage cells, while the module temperature sensor 418 is configured to measure an internal temperature of the energy storage module. More specifically, the temperature sensor senses the temperature close to the power stage consisting of FETs 420, 422, 424, 426. These sensor measurements are communicated from the sensors 406, 408, 418 to the data acquisition and balancing circuit 480 and/or an optional energy module monitoring circuit 402 for processing, measurement acquisition and/or storage in a local datastore 472.

The data acquisition and balancing circuit 480 can perform operations to communicate the sensor measurements as sensor data to control unit 102 of FIG. 1 via a unidirectional or bi-directional communication link. The communication link may also be used to receive control signals from the control unit 102. The control signals can, for example, cause the sensor data to be sent to the control unit and/or cause an optional selective circuit interrupt 470 to transition from a closed state to an open state. Circuit 480 also performs operations to balance cell charge.

Figure 5:
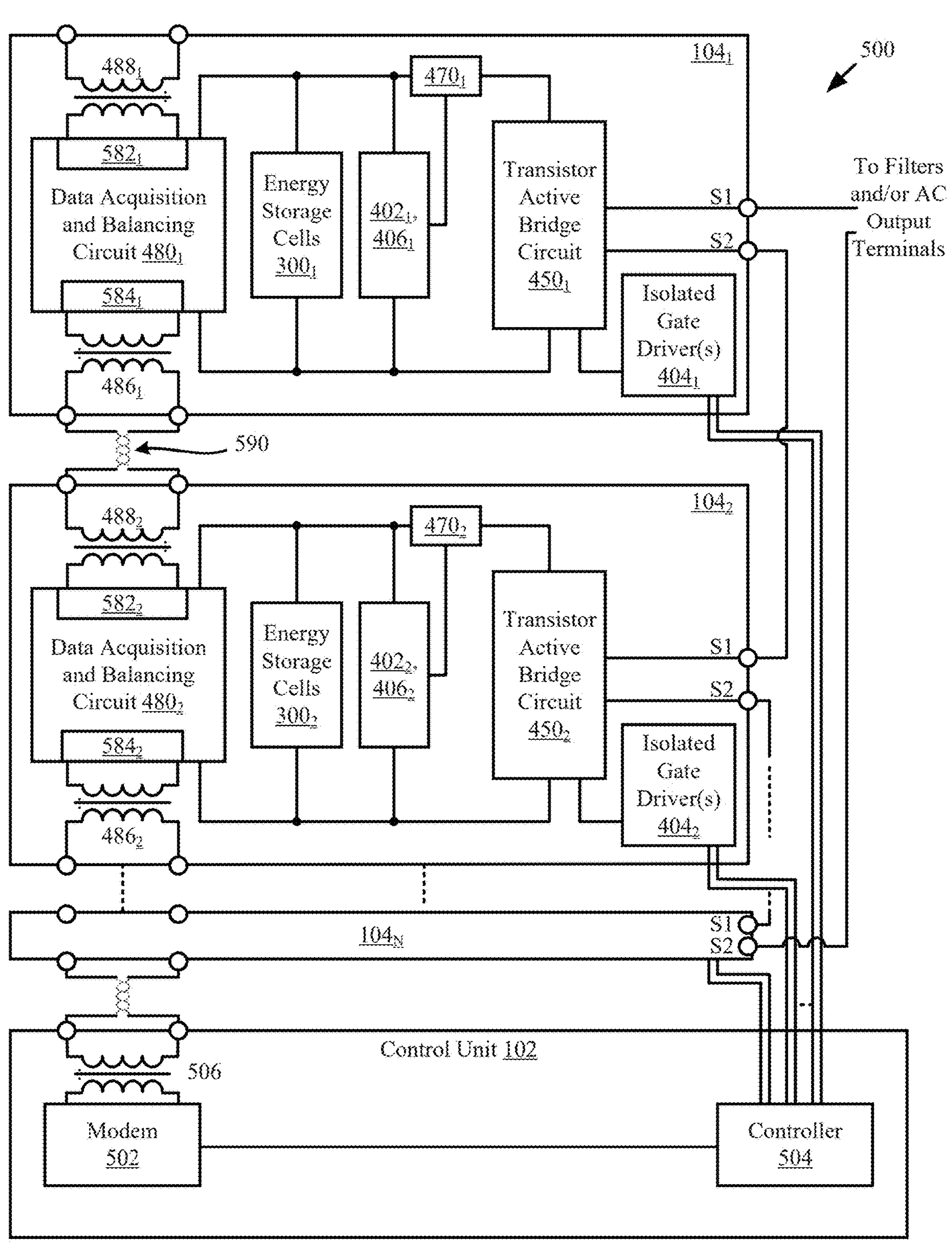
FIG. 5 provide an illustrative block diagram of how the energy storage modules and control unit are communicatively connected to each other in a daisy-chain configuration.

The communication link may comprise a twisted pair cabling or wiring 590 as shown in FIG. 5. As such, the data acquisition and balancing circuit 480 comprises interface circuits 482, 484 each of which generally can be configured to operate in a transmit mode and/or a receive mode. In transmit mode, the interface circuits 482, 484: may generate a duplex communication signal in which the sensor data is arranged serially, translate the duplex communication signal into a differential communication signal (where both lines are referenced to local ground), and communicate the differential communication signal over a twisted pair wiring/cabling 590. In the receive mode, the interface circuits 482, 484 are configured to: receive a differential communication signal that was communicated over the twisted pair wiring/cabling 590; translate the differential communication signal into a duplex communication signal; and pass the half-duplex communication signal to a processor of the circuit 480. In those or other non-limiting embodiments, either or both interface circuits 482 and 484 are serial peripheral interface (SPI) or any of its derivates, e.g., isolated SPI (isoSPI) in standard or proprietary versions, or their likes. More generally, either or both interface circuits 482 and 484 may be serial interfaces, e.g., with isolated (e.g., galvanically isolated) communication components.

Transformers 486, 488 provide electrical isolation between circuit 480 of energy storage module $104_1$ and the circuit of an external device (e.g., other energy storage module(s) $104_2$ and/or control unit 102). The transformers 486, 488 can allow the daisy chain communications to be galvanically isolated and withstand relatively high sources of noise.

The optional energy module monitoring circuit 402 may be configured to analyze sensor measurements to determine if certain criteria is met. For example, if a parameter measurement falls outside of defined range at a given time or for a certain amount of time, then the circuit 402 causes the circuit interrupt 470 to transition from a closed state to an open state such that the power input and output of the energy storage module $104_1$ is turned off. The parameter measurement can include any one or more measurements of operational parameters such as: a voltage measurement, a current measurement or a temperature measurement. Circuit 402 is shown as a separate block from the data acquisition and balancing circuit 480 in FIG. 4. The present solution is not limited in this regard. Blocks 406, 480 can be combined and referred to as a single circuit, rather than two separate circuits.

The circuit 302 also comprises isolated gate driver(s) 404 and a transistor active bridge 450. The transistor active bridge circuit 450 is supplied a DC voltage waveform from the electrical energy storage cells 300. As such, the transistor active bridge circuit 450 is connected to electrical energy storage cells 300 via input lines 410, 412. The transistor active bridge circuit 450 is also connected between a pair of output lines 460, 462. The output lines 460, 462 are connected to terminals 110, 112 of FIG. 1 and/or power out interface 210 of FIG. 2.

The transistor active bridge circuit 450 includes a plurality of switching elements or switches, shown in this example as field-effect transistors (FETs) 420, 422, 424, 426 of an N-channel type. Each of the FETs may comprise a metal-oxide semiconductor FET (MOSFET). Alternatively, other kinds of switches are also possible, such as but not limited to bipolar junction transistor (BJT) or insulated gate bipolar transistor (IGBT) based switches, or even relays. Each FET 420, 422, 424, 426, in this example, has three (3) terminals respectively defined as a source S, a gate G and a drain D. An electrical path is be provided from the source to the drain of each FET 420, 422, 424, 426. This path is generally referred to herein as the source-drain path. A source-drain path of first FET 420 is connected in series with a source-drain path of the second FET 422. The series connected transistor pair 420, 422 form a first series transistor combination that is connected across the input lines 410, 412. A source-drain path of the third FET 424 is connected in series with a source-drain path of the fourth FET 426 to form a second series transistor combination connected across the input lines 410, 412.

The transistor active bridge 450 can have an output defined by output lines 460, 462. A first one of the output lines 460 can be connected to the first series combination 420, 422 at an interconnection point 464 between the first and the second field-effect transistors 420, 422. A second one of the output lines 462 can be connected to the second series combination 424, 426 at an interconnection point 466 between the third and fourth field-effect transistors 424, 426.

Gate driver 404 is provided for driving the gate G of each FET 420, 422, 424, 426. In this regard, the gate driver is configured to supply a voltage to the gate G of each FET at certain times for switching the FET to its "on" state or "off" state. The gate driver is also configured to stop supplying the voltage to the gate G of the FET at certain times for switching the FET to its "on" state or "off" state. Gate driver circuits are well known. Known or to be known gate driver circuit can be used here. In some cases, the gate driver 404 may be realized as different circuits for each or some of the FETs 420, 422, 424, 426.

When the gate driver 404 communicates gate control signals to the FETs 420, 426, the FETs 420, 426 will be biased and switch to their "on" states, thus providing voltage from the electrical energy storage cells or energy storage cells 300 at the output lines 460, 462. In effect, current may flow between the drain D and source S of these FETs to supply a load connected between the output lines 460, 462. The FETs 420, 426 transition back to their "off" states when the gate control signals are no longer being output from the gate driver circuit. Similarly, when the gate driver 404 communicates gate control signals to the FETs 422, 424, the FETs 422, 424 will be biased and switched to their "on" states, thus providing voltage from the electrical energy storage cells 300 at the output lines 460, 462 but in the opposite polarity as compared to the "on" state of the FETs 420 and 426. In effect, current may flow between the drain D and source S of these FETs 422, 424 to supply a load connected between the output lines 460, 462. It shall be appreciated that the load will experience current in opposite polarity in case FETs 422, 424 are "on", as compared to the case when FETs 420, 426 are "on". The FETs 422, 424 transition back to their "off" states when the gate control signals are no longer being output from the gate driver. The gate driver may be configured to prevent the two FETs in each series pair 420/426 and 422/424 from being closed simultaneously or concurrently. It shall be appreciated that switching operation of the FETs may create noise on the input lines 410, 412. For example, in some cases the lower input line 412 may be used as a local ground in the circuit 302 in an energy storage module 104. When switching operations are made e.g., with any of the low-side FETs 422, 424, transients may be generated on the lower input line 412 which get coupled into parts of the circuit 302, e.g., the block 480. The noise signal may get coupled (e.g., as a common-mode noise signal) into the transformer 486 and get propagated to the daisy chain arrangement (e.g., another circuit and/or energy storage module adjacently connected to the block 480 via twisted pair wiring). For example, when the FETs are operated at high frequencies (as non-limiting examples, several hundreds of Hz, kHz range or higher), the transients may create high-frequency common-mode noise. It should be noted that the rate at which the switches are switched does not change the disturbance. The disturbance occurs more frequently, thereby increasing the likelihood to interfere with a data communication frame or package.

FIG. 5 provides an illustration showing the energy storage modules 104 connected in a daisy-chain arrangement with the control unit 102. The energy storage modules 104 are shown as having the same internal circuit. The circuit components are referenced with the same reference number with different subscripts. For example, the transistor active bridge circuit is referred to by number $450_1$ for energy storage module $104_1$, referred to by number $450_2$ for energy storage module $104_2$, and so on. Similarly, the isolated gate driver(s) is (are) referred to by number $404_1$ for energy storage module $104_1$, referred to by number $404_2$ for energy storage module $104_2$, and so on. This numbering scheme also applies to the selective circuit interrupts $470_1$, $470_2$ and other components $300_1$, $300_2$, $402_1$, $402_2$, $406_1$, $406_2$. Each energy storage module 104 may comprise one or more electrical energy storage cells 300 (e.g., at least one battery), e.g., in the form of an energy storage component stack (e.g., a stack of batteries or battery cells).

The energy storage modules have addresses associated therewith such that the control unit 102 can direct control signal to particular one(s) of the energy storage modules via the daisy-chain communications link. Accordingly, the control unit 102 can selectively enable and disable each energy storage module at any time via the daisy-chain communications link. Control signals for the isolated gate drivers $404_1$, $404_2$, . . . , $404_N$ of the energy storage modules $104_1$, $104_2$, . . . , $104_N$ may be communicated through other wiring as shown in FIG. 5.

The daisy-chain communication link is facilitated by the data acquisition and balancing circuits $480_1$, $480_2$, . . . , $480_N$ and transformers $486_1$, $486_2$, . . . , $486_N$, $488_1$, $488_2$, . . . , $488_N$ of the energy storage modules $104_1$, $104_2$, . . . , $104_N$, as well as the twisted pair cabling or wiring 590. The control unit 102 comprises a transformer 506 between its modem 502 and an energy storage module $104_N$. Modem 502 is connected to a controller 504. Controller 504 is configured to process sensor data and/or generate control signals for the energy storage modules. In order to facilitate bi-directional communication, transformer $488_1$ may be connected to modem 502 via another transformer in the control unit 102. This connection is not shown in FIG. 5 for simplicity of illustration.

Figure 6:
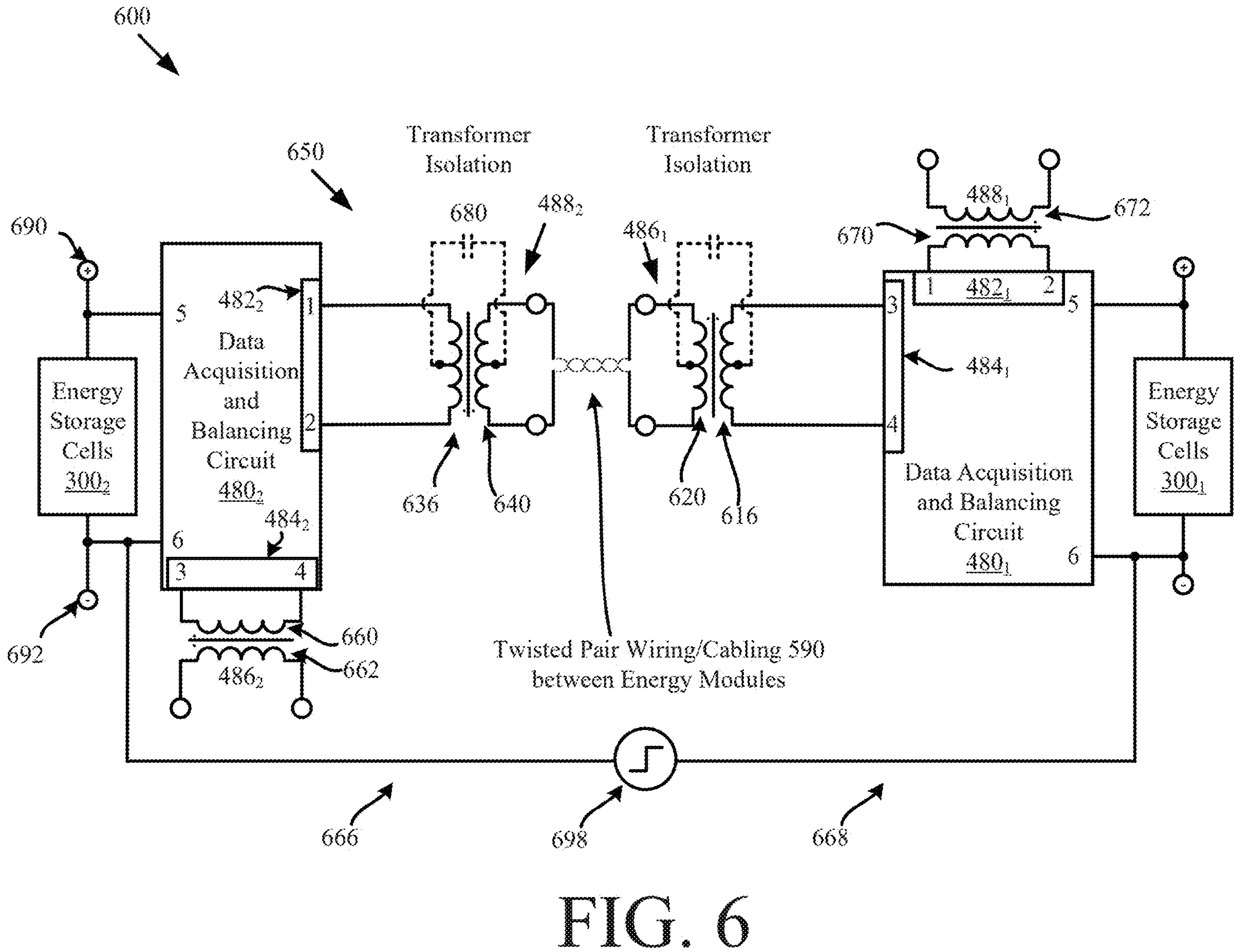
FIG. 6 provides an illustration showing how energy storage modules are communicatively connected to each other via transformers and twisted pair wiring or cabling.

FIG. 6 provides an illustration showing the connections of data acquisition and balancing circuits $480_1$, $480_2$ (e.g., BMS circuits) of two energy storage modules $104_1$, $104_2$. Each data acquisition and balancing circuit $480_1$, $480_2$ comprises interfaces $482_1$, $482_2$, $484_1$, $484_2$ that are each configured to operate in the transmit mode and/or the receive mode. For example, interface $482_2$ of circuit $480_2$ is in its transmit mode. In those or other non-limiting embodiments, each interface $482_1$, $482_2$, $484_1$, $484_2$ may be an isoSPI interface or the likes. In those or other non-limiting embodiments, circuits 480 are BMS chips with isoSPI or similar interface(s). As such, the interface $482_2$ performs the following operations: obtains sensor data; generates a duplex (full or half) communication signal in which the sensor data is arranged serially; translates the duplex communication signal into a complimentary differential communication signal (where both lines are referenced to local ground); and communicates the differential communication signal over a communication link 650 to interface $484_1$ (configured in the receive mode). The communication link 650 comprises twisted pair wiring/cabling 590. The communication link 650 may be dual-unidirectional. Thus, signal $484_1$ may be received or sent.

Transformers $486_1$, $486_2$, $488_1$, $488_2$ provide electrical isolation between the data acquisition and balancing circuits of adjacent devices in the daisy-chain. Transformer $486_1$ comprises two windings, namely a first winding 616 connected to interface $484_1$ and a second winding 620 connected to the twisted pair wiring/cabling 590. Transformer $486_2$ comprises two windings, namely a first winding 660 connected to interface $484_2$ and a second winding 662 connected to a transformer of a data acquisition and balancing circuit (not shown in FIG. 6) in another energy storage module (e.g., energy storage module 1043) via twisted pair wiring/cabling (now shown in FIG. 6). Transformer $488_1$ comprises two windings, namely a first winding 670 connected to interface $482_1$ and a second winding 672 connected to a transformer (now shown in FIG. 6) of another device in the daisy chain (not shown in FIG. 6) (e.g., energy storage module 1040 or modem 502 of FIG. 5) via twisted pair wiring/cabling (now shown in FIG. 6).

Transformer $488_2$ comprises two windings, namely a first winding 636 connected to interface $482_2$ and a second winding 640 connected to the twisting pair wiring/cabling 590. A parasitic capacitance 680 may exist in each transformer. Each winding 662, 672 may be connected to a winding of a transformer of a predecessor or successor device in the daisy chain depending on the direction of communications therein.

Each data acquisition and balancing (e.g., BMS chip) circuit $480_1$, $480_2$ has a plurality of pins 1, 2, 3, 4, 5, 6. Pins 1 and 2 of data acquisition and balancing circuit $480_1$ are connected across a winding 670 of a transformer $488_1$, and pins 3 and 4 of data acquisition and balancing circuit $480_1$ are connected across a winding 616 of another transformer $486_1$. Similarly, pins 1 and 2 of data acquisition and balancing circuit $480_2$ are connected across a winding 640 of a transformer $488_2$, and pins 3 and 4 of data acquisition and balancing circuit $480_2$ are connected across a winding 660 of another transformer $486_2$. Pin 5 of each data acquisition and balancing circuits $480_1$, $480_2$ is connected to a positive terminal 690 and to electrical energy storage cells $300_1$, $300_2$. Pin 6 of each data acquisition and balancing circuits $480_1$, $480_2$ is connected to local ground via terminal 692 and to electrical energy storage cells $300_1$, $300_2$. Terminals 690, 692 are provided to facilitate measurement of voltages of the electrical energy storage stack 500 of FIG. 5.

In a scenario in which energy storage module $104_2$ is communicating a signal from control unit 102 to energy storage module $104_1$, data acquisition and balancing circuit $480_2$ passes information to data acquisition and balancing circuit $480_1$. Accordingly, interface $484_2$ may be referred to as an input or upstream interface of data acquisition and balancing circuit $480_2$ and interface $482_2$ may be referred to as an output or downstream interface of data acquisition and balancing circuit $480_2$. Interface $484_1$ may be referred to as an input or upstream interface of data acquisition and balancing circuit $480_1$ and interface $482_1$ may be referred to as an output or downstream interface of data acquisition and balancing circuit $480_1$.

In another scenario in which energy storage module $104_1$ is communicating sensor data to control unit 102 via energy storage module $104_2$, data acquisition and balancing circuit $480_1$ passes information to data acquisition and balancing circuit $480_2$. Thus, interface $484_1$ may alternatively be referred to as an output or downstream interface of data acquisition and balancing circuit $480_1$ and interface $482_1$ may alternatively be referred to as an input or upstream interface of data acquisition and balancing circuit $480_1$. Interface $482_2$ may alternatively be referred to as an input or upstream interface of data acquisition and balancing circuit $480_2$ and interface $484_2$ may alternatively be referred to as an output or downstream interface of data acquisition and balancing circuit $480_2$.

A common mode voltage source 698 is shown, in FIG. 6, which is an electrical equivalent representation of a signal that is effectively created by the switching of switching elements (e.g., the transistor active bridge circuits in the energy storage modules $104_1$, $104_2$). When low side FETs 422, 426 are "on" in both energy storage modules $104_1$, $104_2$, the local ground pins 6 of both energy storage modules are connected to each other via the FETs. When a high side FET 420 or 424 in one energy storage module is turned "on", the local grounds are shifted to each other (e.g., by the sum of the shifts of the battery modules). The switching occurs within short period of time (e.g., in nanoseconds) thereby creating a high frequency common mode disturbance. The high frequency common mode disturbance is illustrated in FIG. 6 by common mode voltage source 698 and lines 666, 668. Consequently, high frequency common mode noise may exist between the data acquisition and balancing circuit $480_1$, $480_2$ of the two energy storage modules $104_1$, $104_2$ due to the electrical energy storage cells $300_1$, $300_2$ being connected in series. This may result in deterioration or loss of information communicated over communications link 650. The present solution provides a way to minimize or eliminate influence by the high frequency common mode noise at pins 1, 2 or 3, 4 of a receiving interface. The present solution also provides a way to prevent single-ended overdrive of the input stages of the data acquisition and balancing circuits. The manner in which this is achieved will become evident as the discussion progresses.

Figure 7:
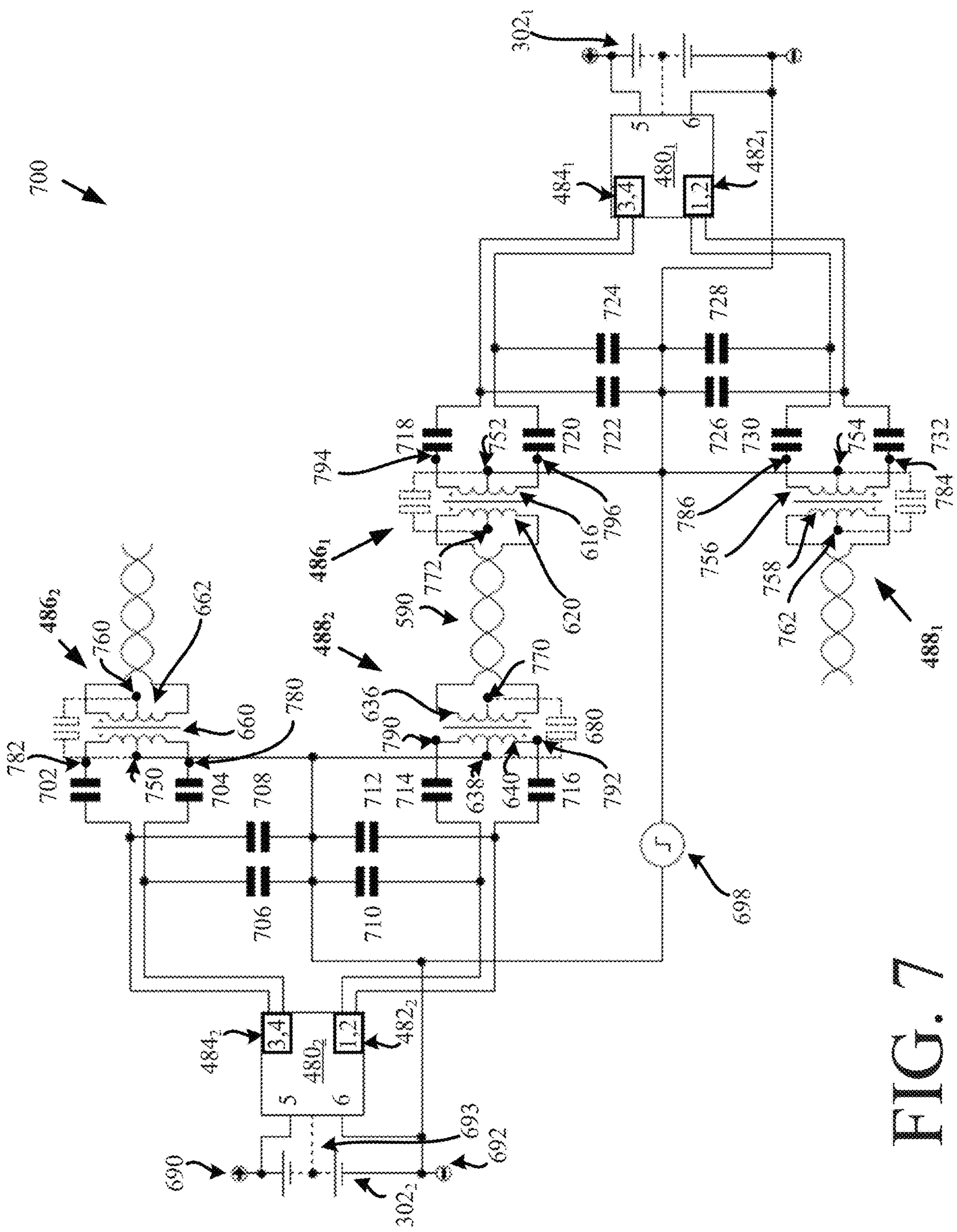
FIGS. 7-9 each provide an illustration of a circuit in which energy storage modules are communicatively connected to each other in accordance with the present solution.

FIG. 7 provides an illustration of a circuit 700 implementing the present solution. Components of circuit 700 which are common in circuit 600 of FIG. 6 are referred to using the same reference numbers. Circuit 700 comprises additional capacitors 702, 704, 706, 708, 710, 712, 714, 716, 718, 720, 722, 724, 726, 728, 730, 732. Capacitors 706-712, 722-728 are also referred to herein as common-mode capacitors and/or bypass capacitors. Bypass capacitors 706-712, 722-728 are generally provided to allow relatively low frequency signals to pass to pins of a receiving interface and couple high frequency noise signals to local ground (e.g., establish a capacitive coupling between the ground potential and each winding terminal). Capacitors 702, 704, 714-720, 730, 732 are also referred to herein as DC blocking capacitors. They can prevent, e.g., DC signals from being passed between the transmitting interface and the respective transformer. A wideband low-impedance coupling is provided between center-tap terminals (e.g., 638) and their respective local ground terminal (e.g., 692). It shall be appreciated that the term local ground terminal (e.g., 692) may include conductively connected network so far as at which the network has low impedance (e.g., wideband low-impedant) e.g., from the point where the lower polarity terminal of energy stack (e.g., 300$_2$, 302$_2$) is connected. The network may include, e.g., printed circuit board traces and/or wires as long as the impedance of the network which is considered local ground terminal is low-ohmic (wideband low-impedance). The term wideband in this context of this disclosure may mean a frequency band (e.g., having a low-pass frequency response) which has a cut-off frequency which is higher (e.g., significantly higher) than the maximum switching frequency in the circuit. The maximum switching frequency may, e.g., be determined by the PWM operation used in the circuit. Additionally, or alternatively, the maximum switching frequency may be determined by an oscillator frequency related to the circuit. The term low-impedance or low-impedant shall be clear to the person with normal skill in the art. It shall be appreciated that low-impedance need not be quantified or be considered limiting to the scope or generality of the present disclosure. For example, how low the low-impedance needs to be may be dictated by the magnitude of interference which can be tolerated in a signal at an interface. For example, lower the tolerable interference, lower impedance a “low-impedance” connection/network may need to have to reduce an undesired voltage drop, e.g., at the signal path of interest (e.g., at an interface). As it shall be appreciated, the low-impedance coupling as proposed, via a low-ohmic (e.g., a direct connection, e.g., between 638 and 692) can significantly reduce parasitic voltage drop at the center tap 638 caused by high-frequency common-mode noise current due to a noise signal transferred via parasitic capacitive coupling 680. This can significantly reduce interference (e.g., caused by operation of switches related to other component stacks) into the differential cell data signal at interface 482$_2$. Similarly, low-impedance connection between center tap 750 and local ground 692 also benefits the signals at interface 484$_2$. Further similarly, wideband low-impedance connection is also shown between center tap 752 and corresponding local ground (as shown, low-polarity terminal of another component stack 302$_1$. Also, center tap 754 which is related to the same component stack 302$_1$ is connected to that local ground. These connections can reduce interference in cell data signals at interfaces 484$_1$ and 482$_1$ respectively (e.g., caused by switches related to the stack 302$_2$). It shall be appreciated that the component stack 302$_1$ or 302$_2$ may be similar to component stacks 300, 300$_1$ or 300$_2$ as discussed in the FIGS.

Operation of the circuit 700 will now be discussed. In a first example scenario, data acquisition and balancing circuit 480$_1$ is communicating information to data acquisition and balancing circuit 480$_2$. This means that interface 482$_2$ of data acquisition and balancing circuit 480$_2$ is in a receiving mode, and interface 484$_1$ of data acquisition and balancing circuit 480$_1$ is in a transmitting mode. The data acquisition and balancing circuit 480$_2$ performs input stage operations to evaluate a difference in voltage (e.g., differential voltage) at pins 1 and 2 of interface 482$_2$. The input stage is usually limited in an absolute voltage (static (e.g., DC) and/or dynamic (e.g., AC)) that might be seen at pins 1 and 2 of interface 482$_2$ due to input requirements (such as dynamic range/linearity) of the interface. Each pin 1 and 2 of interface 482$_2$ has a limited voltage with respect to local ground. The input stage is usually biased at a pre-determined common-mode DC voltage for desired operation (e.g., for maximizing input dynamic range and/or linearity). Circuit 700 is thus designed so that the voltage between pins 1 and 6 of interface 482$_2$ remains at or around a given DC level and the voltage between pins 2 and 6 of interface 482$_2$ also remains around the same DC level (e.g., common-mode DC level). Moreover, the range of voltage swings at the pins 1 and 2 of interface 482$_2$ for proper operation of the input stage is limited (e.g., by the supply voltage of the circuit 480$_2$). Thus, each capacitor 710, 712 provides a capacitive coupling between the local ground terminal 692 and each winding terminal 790, 792 connected to pins 1 and 2 of interface 482$_2$, respectively. It shall be appreciated that coupling of local ground to pins 1, 2 provided by bypass capacitors (e.g., 710, 712) has low impedance at high frequencies. Capacitors 714, 716 prevent pins 1, 2 of interface 482$_2$ from being shorted to ground and prevents interference into DC level at pins 1, 2 by ground potential.

In a second example scenario, data acquisition and balancing circuit 480$_2$ is sending data to data acquisition and balancing circuit 480$_1$. This means that interface 482$_2$ of data acquisition and balancing circuit 480$_2$ is in a transmitting mode, and interface 484$_1$ of data acquisition and balancing circuit 480$_1$ is in a receiving mode. In this mode too, the DC offset (e.g., common-mode DC voltage) of pins 1 and 2 of data acquisition and balancing circuit 480$_2$ needs to be at a certain value (e.g., 2.5 Volts) when interface 482$_2$ is in its transmitting mode (e.g., for maximizing dynamic range of output differential signal provided via these pins 1 and 2). If a center tap 638 of transformer 488$_2$ is connected to the local ground pin 6 of data acquisition and balancing circuit 480$_2$ without capacitors 714, 716 being present, a short circuit of the DC offset between pins 1, 2 is effectively created whereby the data acquisition and balancing circuit 480$_2$ may be damaged or operate incorrectly. Capacitors 714, 716 are provided to decouple the DC offset at pins 1 and 2 from the local ground pin 6 which is connected directly to the center tap 638 of winding 640 of transformer 488$_2$. Capacitors 714, 716 in this example are thus used for isolating DC potential at the local ground pin 6 (or the local ground terminal 692) from DC potential of the differential terminals (pins 1, 2). Capacitors 710, 712 act as a short circuit when there is a high frequency signal from lines from pins 1, 2 to pin 6. It shall be appreciated that the components discussed above are not limited to a specific mode (e.g., transmit or receive mode). In those or other non-limiting embodiments, any of the interfaces may operate in transmit or receive mode either permanently, or at given times. Thus, in those or other non-limiting embodiments either of the interfaces is operable in a transmit mode or a receive mode without limitation to the components (e.g., capacitors) discussed.

In transmit mode, the capacitors 706, 708 limit voltage slew rate thereby partially acting as a pulse-forming component together with the current limited transmit stage of the chip. In receive mode, the capacitors 706, 708 limit the voltage slew rate at pins 3, 4 of interface 484$_2$ in order to mitigate the effect of high frequency disturbances. Capacitors 702, 704 are provided to decouple the DC offset between pins 3 and 4 from local ground when interface 484$_2$ is in its transmitting mode. DC coupling is provided in both the transmit and receive modes, i.e., the receiver and transmitter stage of interface (IF) need a DC offset for proper operation. Capacitors 722-728 are provided to operate in a manner similar to capacitors 706-712. Capacitors 718, 720, 730, 732 are provided to operate in a manner similar to capacitors 702, 704, 714, 716. It should be noted that the center taps 750, 752, 754 of windings 660, 616, 756 of transformers 486$_2$, 486$_1$, 488$_1$ are also connected directly to the local ground.

In view of FIG. 7, it shall be appreciated that in a transmit mode, the present solution also concerns implementing systems and methods for transmitting cell data of an electrical energy storage component stack (e.g., 300$_2$ or 302$_2$) comprising a local ground terminal (e.g., 692). The methods may comprise: providing, via a plurality of sense terminals (e.g., terminals 690, 693), a plurality of cell measurement signals associated with the electrical energy storage component stack (e.g., 300$_2$ or 302$_2$), wherein the plurality of cell measurement signals are referenced to a ground potential at a local ground terminal (e.g., 692); providing via a first interface (e.g., 482$_2$) at least some of the plurality of cell measurement signals as a first differential cell data signal, wherein the first interface (e.g., 482$_2$) is in a transmit state and comprises differential terminals (e.g., 1, 2); providing the first differential cell data signal at a first winding (e.g., 640) of a first transformer (e.g., 488$_2$) connected via DC block capacitors (e.g., 714, 716) to the first interface (e.g., 482$_2$); establishing a coupling between the local ground terminal (e.g., 692) and each of the differential terminals (e.g., 1, 2) (e.g., of the first interface (e.g., 482$_2$) via a bypass capacitor disposed between a respective one of the differential terminals (e.g., 1, 2) and the local ground terminal (e.g., 692); referencing a center tap (e.g., 638) located between the winding terminals (e.g., 790, 792) of the first transformer (e.g., 488$_2$) to the local ground terminal (e.g., 692) via a conductive connection (e.g., a low-impedance conductive connection). The conductive connection establishes a low-impedance (e.g., a wideband low-impedance) coupling between the center tap and the local ground terminal. It shall be appreciated that the low-impedance coupling as provided by the low-ohmic (e.g., a direct connection) reduces parasitic voltage drop at the center tap caused by high-frequency common-mode noise current due to a noise signal transferred via parasitic capacitive coupling (e.g., 680) between windings of the first transformer, thereby reducing interference caused by the noise signal in the first differential cell data signal.

Similarly, it shall be appreciated that, in a receive mode, the present solution also concerns implementing systems and methods for receiving cell data of an electrical energy storage component stack (e.g., 302$_2$) comprising a local ground terminal (e.g., 692). The methods may comprise: providing a first differential cell data signal at a first winding (e.g., 640) of a first transformer (e.g., 488$_2$) connected via DC block capacitors (e.g., 714, 716) to a first interface (e.g., 482$_2$). In this case, the first interface (482$_2$) is in a receive state and comprises differential terminals (1, 2)). The methods may also comprise; establishing a coupling between the local ground terminal (e.g., 692) and each of the differential terminals (e.g., 1, 2) (of the first interface, e.g., 482$_2$) via a bypass capacitor (e.g., 710, 712 respectively) disposed between a respective one of the differential terminals (e.g., 1, 2 respectively) and the local ground terminal (e.g., 692); referencing a center tap (e.g., 638) located between the winding terminals (790, 792) of the first transformer (e.g., 488$_2$) to the local ground terminal (e.g., 692) via a conductive connection (e.g., a low-impedance conductive connection). The conductive connection establishes a low-impedance (e.g., a wideband low-impedance) coupling between the center tap and the local ground terminal. It shall be appreciated that the low-impedance coupling as provided by the low-ohmic (e.g., a direct connection, e.g., between 638 and 692) reduces parasitic voltage drop at the center tap caused by high-frequency common-mode noise current due to a noise signal transferred via parasitic capacitive coupling (e.g., 680) between windings (e.g., 636 and 640) of the first transformer (e.g., 488$_2$), thereby reducing interference caused by the noise signal (e.g., 698) in the first differential cell data signal.

It shall be appreciated that although the above examples are illustrated with interface 482$_2$ and thereon connected components (e.g., 488$_2$, 714, 716, 710 and 712), the present teachings apply to any other interfaces in the circuit 700, e.g., interface 484$_1$ and thereon connected components (e.g., 486$_1$, 718, 720, 722 and 724). Any of the interfaces may be either be exclusively in receive mode or transmit mode, or any of the interfaces may be switchable between transmit and receive modes, as per requirement and/or intermittently at regular or irregular time periods.

By taking another interface as a non-limiting example, it shall also be appreciated that the present solution further concerns implementing systems and methods for operating a circuit (e.g., 700) or a part thereof. The methods may comprise: providing a conductive connection between a local ground (e.g., 692) (e.g., ground terminal of a module, or part, the circuit 700) to a center tap (e.g., 750) of a transformer winding (e.g., 660) (e.g., the center tap (750) located between first winding terminal (e.g., 780) and second winding terminal (e.g., 782)) (e.g., for providing a common mode coupling between the local ground (e.g., 692) and the center tap (e.g., 750)); providing a first signal coupling (or signal path) between a first winding terminal (e.g., 780) of the transformer winding (e.g., 660) and a first differential terminal (e.g., 4) of an interface circuit (e.g., 484$_2$) via a first DC blocking capacitor (e.g., 704); providing a second coupling between a second winding terminal (e.g., 782) of the transformer winding (e.g., 660) and a second differential terminal (e.g., 3) of an interface circuit (e.g., 484$_2$) via a second DC blocking capacitor (e.g., 702); providing a coupling (e.g., electrical connection) between the local ground (e.g., 692) and first differential terminal (e.g., 4) via a first bypass capacitor (e.g., 706); providing a connection between the local ground (e.g., 692) and the second differential terminal (e.g., 3) via a second bypass capacitor (e.g., 708); passing first complimentary differential communication signals between (e.g., to or from) the transformer winding (e.g., 660) and the interface circuit (e.g., 484$_2$); and using the first and second bypass capacitors (e.g., 706, 708) to prevent or minimize an effect of a high frequency common mode disturbance to the first complimentary differential communication signals at (e.g., being received by and/or transmitted by) the interface circuit (e.g., 484$_2$).

By taking yet another non-limiting example, it shall also be appreciated that the present solution further concerns implementing systems and methods for battery management systems (BMS). For example, there can be provided a battery management system (BMS) circuit (e.g., 700), comprising a plurality of terminals (e.g., 690, 692, 693) configured to facilitate measurement of voltages of an electrical energy storage stack (e.g., 300, 302$_2$, 500). At least one of the terminals (e.g., 692) may form local ground for the BMS circuit. The BMS circuit may also comprise a first transformer (e.g., 486$_2$) which comprises a first winding (e.g., 662) and a second winding (e.g., 660). The first winding (e.g., 662) may have a first center tap (e.g., 760). The second winding (e.g., 660) may have a second center tap (e.g., 750). The BMS circuit may also comprise a second transformer (e.g., 488$_2$) which comprises a third winding (e.g., 636), and a fourth winding (e.g., 640). The third winding (e.g., 636) may have a third center tap (e.g., 770). The fourth winding (e.g., 640) may have a fourth center tap (e.g., 638). The BMS circuit may also comprise a first interface circuit (e.g., 484$_2$). The first interface circuit (e.g., 484$_2$) may comprise a first set of differential terminals (e.g., 3, 4). The first set of differential terminals (e.g., 3, 4) may be connected to the second winding (e.g., 660) of the first transformer (e.g., 486$_2$) via a first set of DC block capacitors (e.g., 702, 704). For example, a first differential terminal (e.g., 4) may be connected to a first winding terminal (e.g., terminal 780) via a first DC blocking capacitor (e.g., 704). A second differential terminal (e.g., 3) may be connected to a second winding terminal (e.g., terminal 782) via a second DC blocking capacitor (e.g., 702). The BMS circuit may also comprise a second interface circuit (e.g., 482$_2$). The second interface circuit (e.g., 482$_2$) may comprise a second set of differential terminals (e.g., 1, 2). The second set of differential terminals (e.g., 1, 2) may be connected to the fourth winding (e.g., 640) of the second transformer (e.g., 488$_2$) via a second set of DC block capacitors (e.g., 714, 716). For example, a third differential terminal (e.g., 2) may be connected to a third winding terminal (e.g., terminal 792) via a third DC blocking capacitor (e.g., 716). A fourth differential terminal (e.g., 1) may be connected to a fourth winding terminal (e.g., terminal 790) via a fourth DC blocking capacitor (e.g., 714). There may be provided a common-mode coupling between local ground terminal (e.g., 692) and each of the second center tap (e.g., 760) and the fourth center tap (e.g., 638) via a conductive (e.g., wideband low-impedant) connection. The BMS circuit may also comprise at least one first bypass capacitor (e.g., 706,708) connected between each of differential terminals (e.g., 3, 4 respectively) of the first interface circuit (e.g., 484$_2$) and the local ground terminal (e.g., 692). The BMS circuit may also comprise at least one first bypass capacitor (e.g., 710,712) connected between each of second set of differential terminals (e.g., 1, 2 respectively) of the second interface circuit (e.g., 482$_2$) and the local ground terminal (e.g., 692). Additionally, or alternatively, the BMS circuit may comprise at least one first bypass capacitor (e.g., 706,708) connected between each of first set of differential terminals (e.g., 3, 4 respectively) of the second interface circuit (e.g., 482$_2$) and the local ground terminal (e.g., 692). For example, a first bypass capacitor (e.g., 706) is connected between the first differential terminal (e.g., 4) and the local ground terminal (e.g., 692). Additionally, or alternatively, a second bypass capacitor (e.g., 708) is connected between the second differential terminal (e.g., 3) and the local ground terminal (e.g., 692). Additionally, or alternatively, a third bypass capacitor (e.g., 710) is connected between the third differential terminal (e.g., 2) and the local ground terminal (e.g., 692). Additionally, or alternatively, a fourth bypass capacitor (e.g., 712) is connected between the fourth differential terminal (e.g., 1) and the local ground terminal (e.g., 692). The low-impedance conductive connection is such that it establishes a low-impedance (e.g., a wideband low-impedance) coupling between the respective center taps and the local ground terminal (e.g., 692). The low-impedance coupling as provided by a low-ohmic (e.g., a direct connection, e.g., with) reduces parasitic voltage drop at the center tap caused by high-frequency common-mode noise current due to a noise signal transferred via parasitic capacitive coupling between windings of the first transformer (e.g., 486$_2$) and/or the second transformer (e.g., 488$_2$), thereby reducing interference caused by the noise signal in the differential cell data signals at the first interface and/or the second interface.

Figure 8:
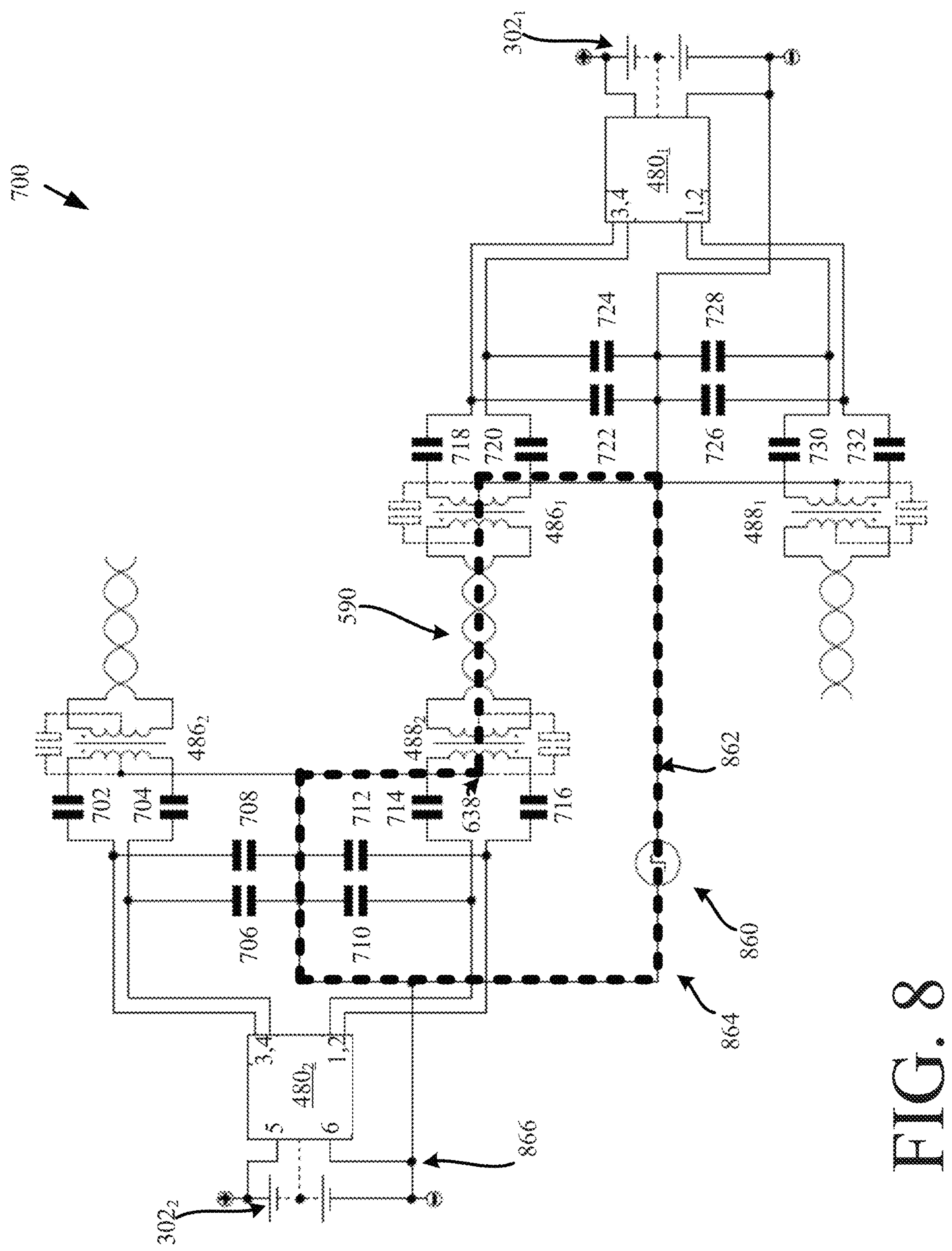

FIG. 8 provides an illustration that is useful for understanding the effects of high frequency common mode noise on circuit 700. Similar to the common mode voltage source 698 shown in FIG. 6, a high-frequency common mode voltage source 860 is effectively created by the switching of the transistor active bridge circuits in the energy storage modules 104$_1$, 104$_2$. When low side FETs 422, 426 are "on" in both energy storage modules 104$_1$, 104$_2$, the local ground pins 6 of both energy storage modules are connected to each other via the FETs. When a high side FET 420 or 424 in energy storage module 104$_2$ is turned "on", the local grounds are shifted to each other by the sum of the shifts of battery modules. The switching occurs within nanoseconds thereby creating a high frequency common mode disturbance. The high frequency common mode disturbance is illustrated in FIG. 8 electrical equivalent by common mode voltage source 860. The high frequency common mode disturbance causes a current to flow along the path shown by the bolded dotted line 862. The common mode current may originate in a switching stage 864 of an energy storage module 104$_2$ and travel through the parasitic capacitor of transformer 488$_2$ and on to transformer 486$_1$, through the parasitic capacitor of transformer 486$_1$, through local ground and back to the switching stage 864. The present solution allows that effect of the common mode current is reduced from affecting the data being communicated between energy storage modules 104$_1$, 104$_2$. This is achieved by preventing the common mode voltage from being converted into differential voltage representing the data via provision of a symmetrical circuit. There are two steps: (i) common mode current along the dotted line causes a common mode voltage drop (e.g., in the transformer center tap grounding path); and (ii) the common mode voltage might again be transformed into a differential mode voltage actually disturbing the differential signal. The common mode voltage drop of step (i) is reduced in the present circuit as it may disturb the interfaces' input stage. The differential signal disturbance may be mitigated by the symmetric circuit (including the center tap and equal capacitances). The symmetrical circuit is provided, for example, by using the same capacitance at capacitor 710 and capacitor 712. If different capacitances are used at 710, 712, than common mode voltage may be converted into differential voltage.

If a significant voltage drop occurs between a center tap 638 of transformer 488$_2$ and the point 866 where the data acquisition and balancing circuit 480$_2$ is connected to local ground, the voltage drop will be seen on top of the voltage on both data lines essentially equally. So, the difference of it can be canceled out (completely or significantly) resulting in no or significantly reduced differential signal disturbance, but each single line might exceed the valid range (e.g., 2.5 V) of 480s IF. The voltage drop should be minimized so that the voltages on the data lines remain within a given range. To do this, the circuit is designed to provide a relatively low impedance between the center tap 638 of transformer 488$_2$ and point 866. In this regard, the center tap 638 of transformer 488$_2$ is directly connected to point 866 without any intermediary devices.

Figure 9:
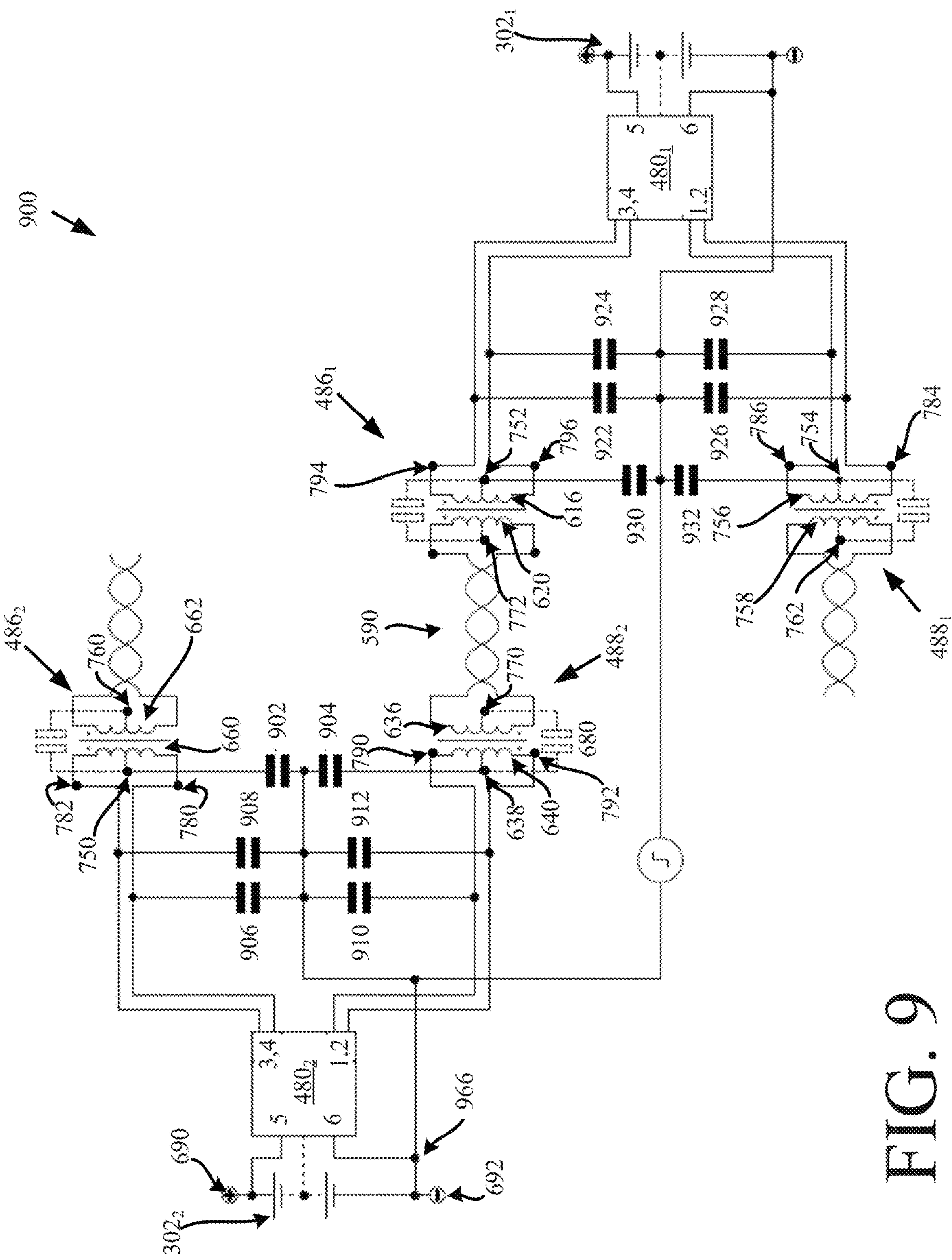

FIG. 9 shows another circuit 900 implementing the present solution. Components of circuit 900 which are common in circuit 600 of FIG. 6 are referred to using the same reference numbers. Circuit 900 comprises additional capacitors 902, 904, 906, 908, 910, 912, 922, 924, 926, 928, 930, 932. Capacitors 906-912, 922-928 are also referred to herein as common-mode capacitors and/or bypass capacitors. Bypass capacitors 906-912, 922-928 are generally provided to allow relatively low frequency signals to pass to pins of a receiving interface and cause high frequency noise signals to be bypassed to local ground. Capacitors 902, 904, 930, 932 are also referred to herein as DC blocking and bypass capacitors since they (i) prevent DC signals from being transmitted from the transmitting interface and (ii) bypasses the common mode current to local ground. The center tap 638 of transformer 5682 is connected to point 966 via capacitor 904.

As evident from FIGS. 4-9, each of the energy storage modules 104 comprises a battery management system (BMS) circuit. The BMS circuit comprises a plurality of terminals 690, 692 configured to facilitate measurement of voltages of an electrical energy storage stack 500. At least one of the terminals 692 forms a local ground for the BMS circuit. A first transformer (e.g., transformer 488$_1$ or 486$_2$) is provided with a first winding (e.g., winding 758 or 662) and a second winding (e.g., winding 756 or 660). The first winding (e.g., winding 758 or 662) has a first center tap (e.g., center tap 762 or 760). The second winding (e.g., winding 756 or 660) has a second center tap (e.g., center tap 754 or 750). A second transformer (e.g., transformer 488$_2$ or 486$_1$) is provided with a third winding (e.g., winding 636 or 620) and a fourth winding (e.g., winding 640 or 616). The third winding (e.g., winding 636 or 620) has a third center tap (e.g., center tap 770 or 772). The fourth winding (e.g., winding 640 or 616) has a fourth center tap (e.g., center tap 638 or 752). A first interface circuit (e.g., interface circuit 484$_2$ or 482$_1$) is connected to the second winding (e.g., winding 660 or 756). A second interface circuit (e.g., 484$_1$ or 482$_2$) is connected to the fourth winding (e.g., winding 616 or 640). Each of the second center tap (e.g., center tap 754 or 750) and the fourth center tap (e.g., center tap 638 or 752) is directly connected or has a common-mode coupling to the local ground.

A first bypass capacitor (e.g., capacitor 706, 726, 906, or 926) is provided for a first winding terminal (e.g., terminal 780, 784) of the second winding (e.g., winding 756, 660) of the first transformer (e.g., transformer 488$_1$, 486$_2$). A second bypass capacitor (708, 728, 908, or 928) is provided for a second winding terminal (e.g., terminal 782, 786) of the second winding (e.g., winding 756, 660) of the first transformer (e.g., transformer 488$_1$, 486$_2$). Each of the first and second bypass capacitors (e.g., capacitor 706, 726, 708, 728, 900, 908, 926, 928) connects local ground to a respective first or second winding terminal of the second winding (e.g., winding 756, 660) of the first transformer (e.g., transformer 488$_1$, 486$_2$).

A third bypass capacitor (e.g., capacitor 710, 722, 910 or 922) is provided for a first winding terminal (e.g., terminal 790 or 794) of the fourth winding (e.g., winding 640 or 616) of the second transformer (e.g., transformer 488$_2$ or 486$_1$). A fourth bypass capacitor (e.g., 712, 724, 912 or 924) is provided for a second winding terminal (e.g., terminal 792 or 796) of the fourth winding (e.g., winding 640 or 616) of the second transformer (e.g., transformer 488$_2$ or 486$_1$). Each of the third and fourth bypass capacitors (710, 712, 722, 724, 910, 912, 922 or 924) connects local ground to a respective first or second winding terminal (e.g., terminal 790, 792, 794 or 796) of the fourth winding (e.g., winding 640 or 616) of the second transformer (e.g., transformer 488$_2$ or 486$_1$).

In some scenarios such as that shown in FIGS. 7-8, a first DC blocking capacitor (e.g., capacitor 704 or 732) is connected between the first interface circuit (e.g., interface circuit 484$_2$ or 482$_1$) and the first winding terminal (e.g., terminal 780 or 784) of the second winding (e.g., winding 660 or 756) of the first transformer (e.g., transformer 488$_1$ or 486$_2$). A second DC blocking capacitor (e.g., capacitor 702 or 730) is connected between the first interface circuit and the second winding terminal (e.g., terminal 782 or 786) of the second winding (e.g., winding 660 or 756) of the first transformer (e.g., transformer 488$_1$ or 486$_2$).

A third DC blocking capacitor (e.g., 714 or 718) is connected between the second interface circuit (e.g., interface circuit 484$_1$ or 482$_2$) and the first winding terminal (e.g., terminal 790 or 794) of the fourth winding (e.g., winding 640 or 616) of the second transformer (e.g., transformer 488$_2$ or 486$_1$). A fourth DC blocking capacitor (e.g., 716 or 720) is connected between the second interface circuit (e.g., interface circuit 484$_1$ or 482$_2$) and the second winding terminal (e.g., terminal 792 or 796) of the fourth winding (e.g., winding 640 or 616) of the second transformer (e.g., transformer 488$_2$ or 486$_1$).

In other scenarios such as that shown in FIG. 9, a first dual purpose capacitor (e.g., capacitor 902 or 932) is connected between local ground and the second center tap (e.g., center tap 750 or 754) of second winding (e.g., winding 660 or 756) of first transformer (e.g., transformer 486$_2$ or 488$_1$). A second dual purpose capacitor (e.g., capacitor 904 or 930) is connected between local ground and the fourth center tap (e.g., center tap 638 or 752) of the fourth winding (e.g., winding 640 or 616) of the second transformer (e.g., transformer 488$_2$ or 486$_1$). Each of the first and second dual purpose capacitors (e.g., capacitor 902, 904) is configured to (i) prevent DC signals from being transmitted from respective interface when transmitting and receiving, and (ii) bypasses the common mode current to local ground.

Figure 10A:
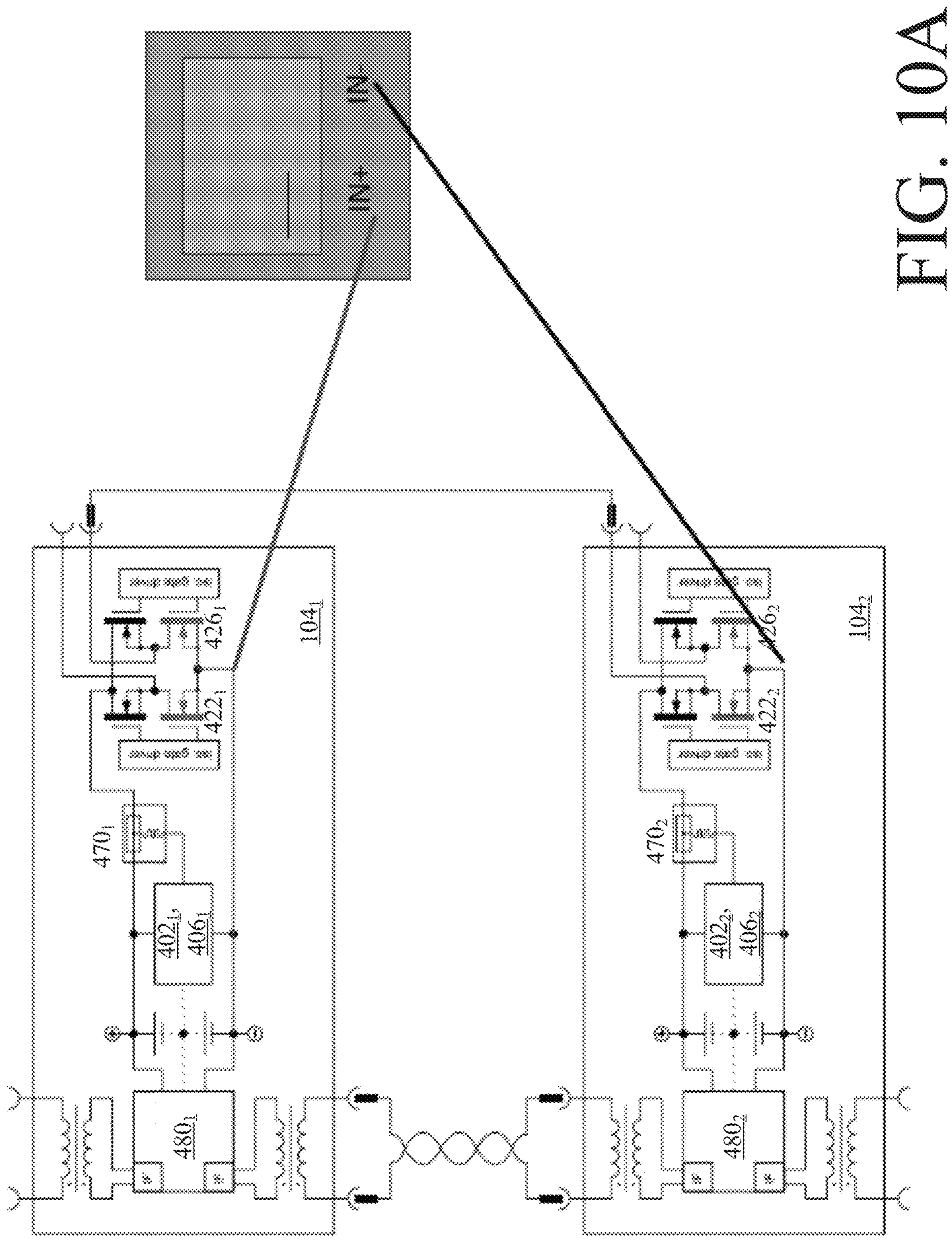
FIGS. 10A-10B (collectively referred to as "FIG. 10"), FIGS. 11A-11B (collectively referred to as "FIG. 11"), FIGS. 12-16, FIGS. 17A-17B (collectively referred to as "FIG. 17") provide illustrations that are useful for understanding the present solution.
Figure 10B:
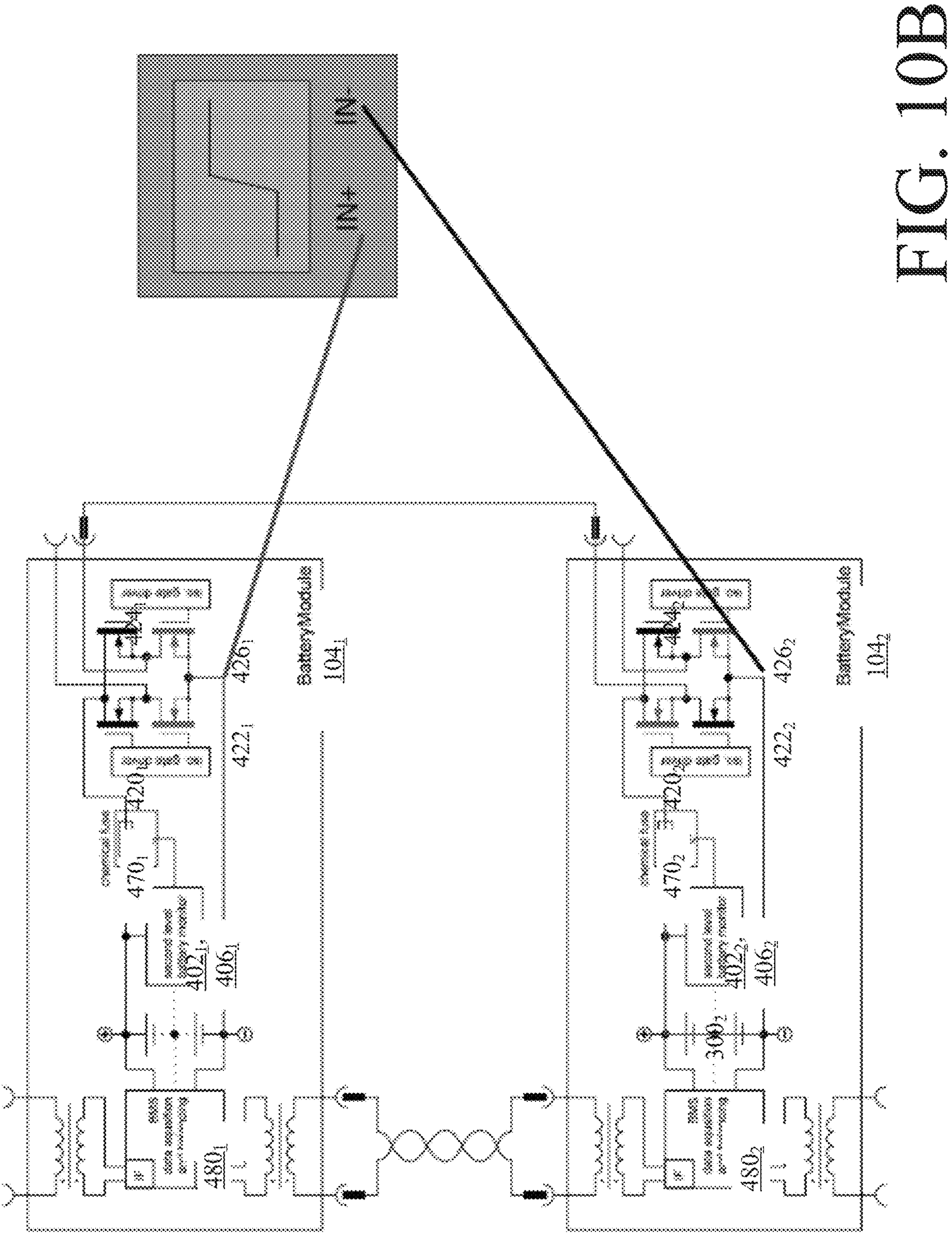

Referring now to FIGS. 10A-10B (collectively referred to as "FIG. 10"), illustrations are provided to show the connection between two adjacent energy storage modules (e.g., energy storage modules 104$_1$ and 104$_2$ of FIGS. 1-5). In a first state shown in FIG. 10A, all four low-side transistors 4221, 4261, 4222, 4262 might be turned "on". Both local ground terminals are basically at the same electrical potential. In a second state shown in FIG. 10B, one of the low-side transistors 4222 in one of the energy storage modules 104$_2$ is turned "off" and the corresponding high-side transistor 4202 is turned "on". Now, there is a significant difference (voltage) between the local ground terminals that is equal to the sum voltage of the energy storage component stack 300$_2$ in the lower energy storage module 104$_2$. The transition between these two states may take nanoseconds and happen frequently.

FIG. 10 also shows a voltage probe with its first terminal connected to a local ground node of the upper energy storage module $104_1$ and with its other terminal connected to the local ground node of the lower energy storage module $104_2$. When a transition from the first state to the second state occurs, this voltage probe sees a step function with a step height of the lower energy storage module's $104_2$ energy storage component stack. This is a common mode voltage disturbance with substantial high frequency (HF) portion. As such, there is a need to use bypass capacitors to limit the HF noise on the interface circuit pins of the data acquisition and balancing circuits $480_1$, $480_2$. The data acquisition and balancing circuits $480_1$, $480_2$ couple the interface pins to local ground internally. There is a parasitic capacitance in the transformers. Thus, the present solution effectively creates a path where this common mode voltage might cause a common mode current to flow.

Figure 11A:
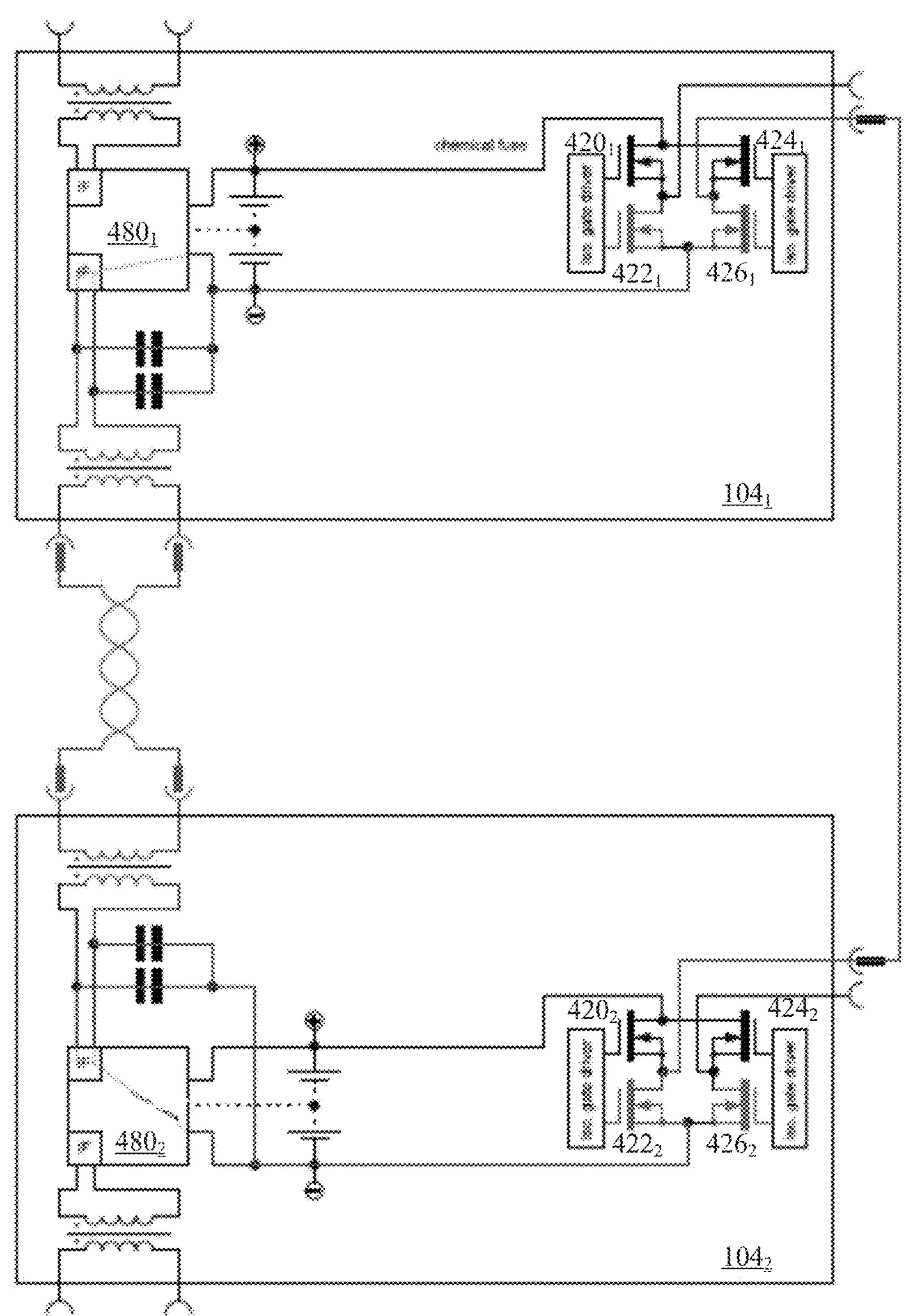
Figure 11B:
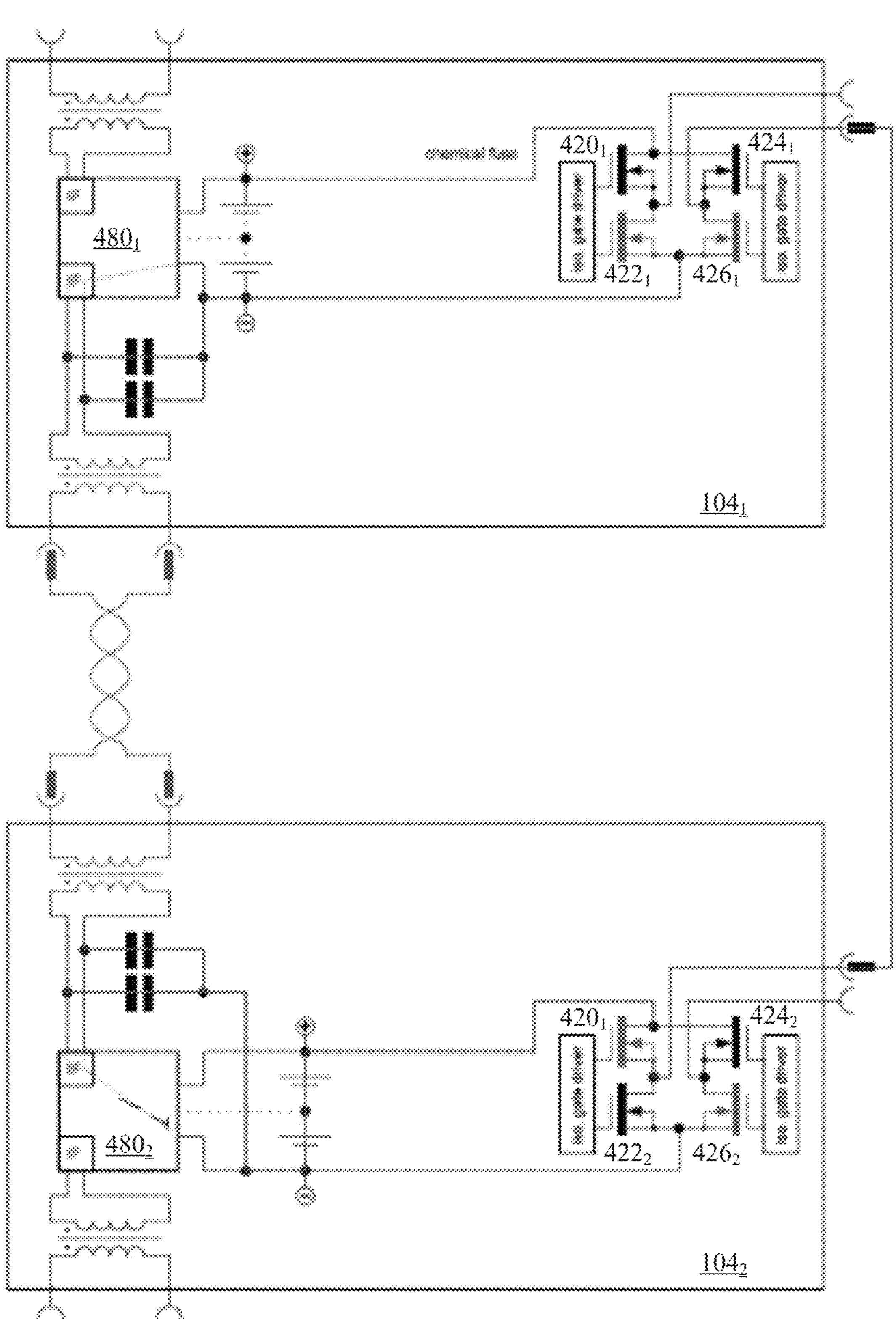

As the current flows through both bypass caps (and maybe also through the substrate (e.g., silicon) of 480) per interface circuit, it causes a voltage drop across each capacitor. Both voltage drops are equal as the circuit is symmetrical. In other terms, the current flowing through the path depicted in red in FIGS. 11A-11B (caused by the state transition) causes a common mode voltage across the bypass capacitors. The problem to be solved is to minimize this disturbance in a way that the communication between the two interface circuits are not affected.

To address this problem, one might try to increase the capacitance of the bypass capacitors. However, these capacitors are also 'active' for differential signal on the data line needed for communication. Increasing the capacitance too far also cuts the amplitude of the differential mode signal. In some scenarios, a capacitance in the range of 47 picofarads (pF) to 220 pF is adequate with use of the data acquisition and balancing circuits $480_1$, $480_2$. The present solution is not limited to these particular capacitance values.

Figure 12:
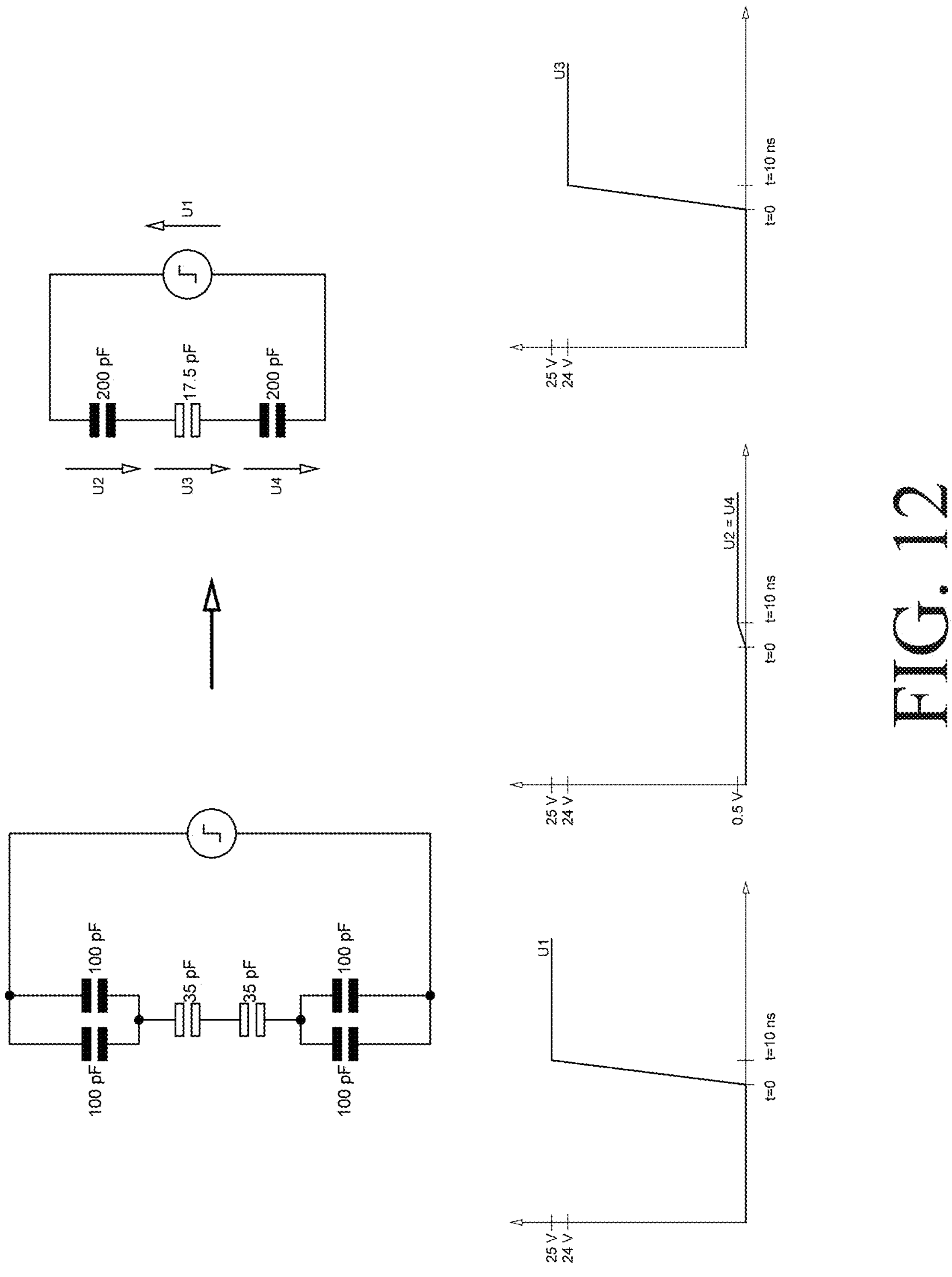

An equivalent circuit of the arrangement is shown in FIG. 12. In FIG. 12 it is assumed that the bypass capacitors have a capacitance of 100 pF. The parasitic transformer capacitance may be around 35 pF. The present solution is not limited to the shown capacitance values. Other capacitance value can be selected in accordance with a given application. As non-limiting examples, the bypass capacitance can be in the range of 33 pF to 330 pF, e.g., 50 pF, 75 pF, 100 pF, 150 pF, 200 pF or 250 pF. The parasitic transformer capacitance can, for example, be in the range of 1 pF to 100 pF. This architecture provides a capacitive voltage divider.

Figure 13:
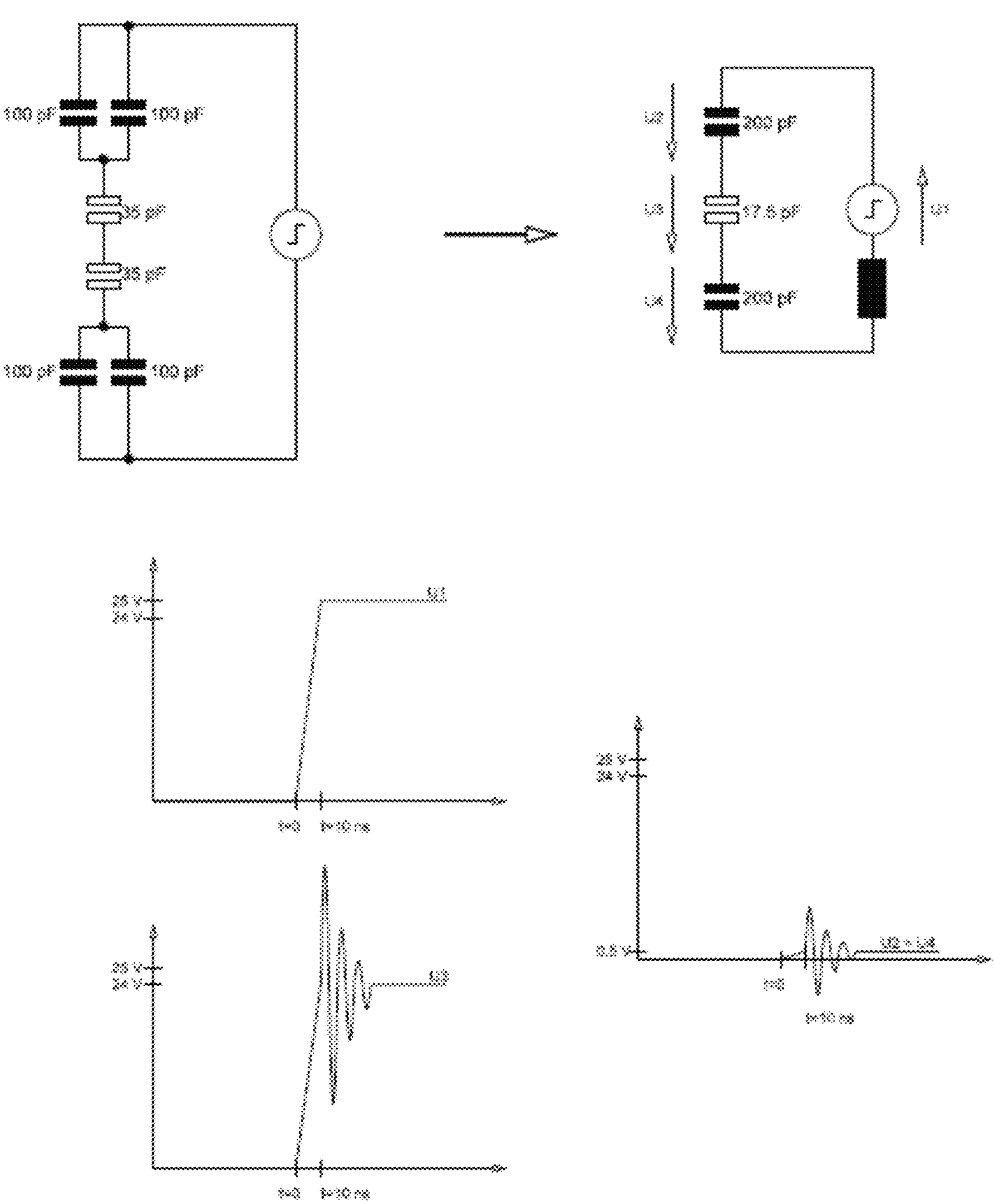

The purely capacitive situation is depicted in FIGS. 12-13. A disturbance of around 500 mV is provided. However, in reality, the circuit also comprises parasitic inductance(s) which cause the whole arrangement to act as a series resonant circuit being excited by the step function. This causes common mode voltages way higher than 500 mV in reality. This might disturb the interface of the data acquisition and balancing circuit $480_1$, $480_2$. especially when in a receive state.

This current remains. So, the present solution is designed to minimize the step function in voltage drop caused by the current. In the circuit thus far, a differential mode signal and a common mode signal take the same path. The present solution is also designed to change this.

Figure 15:
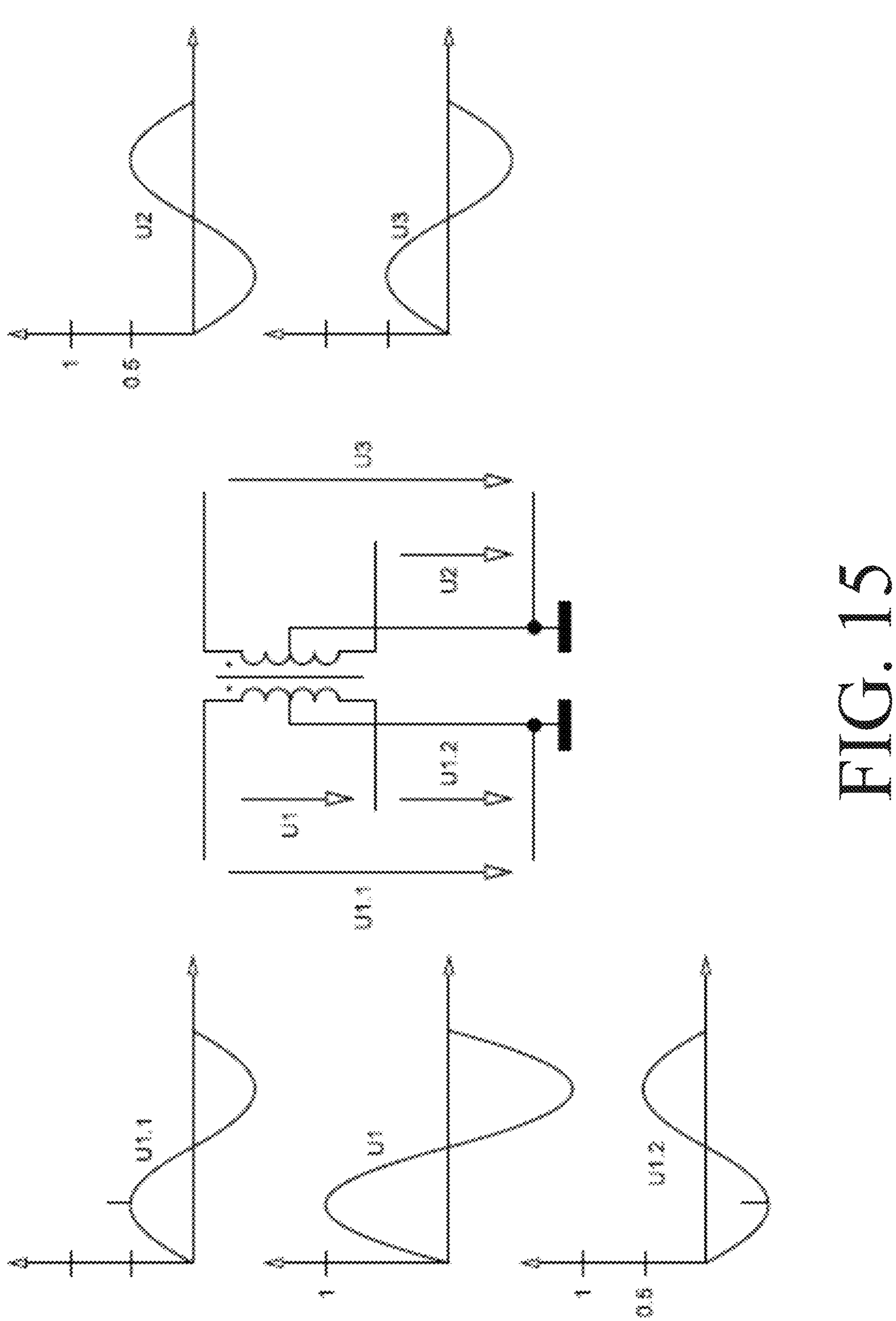
Figure 16:
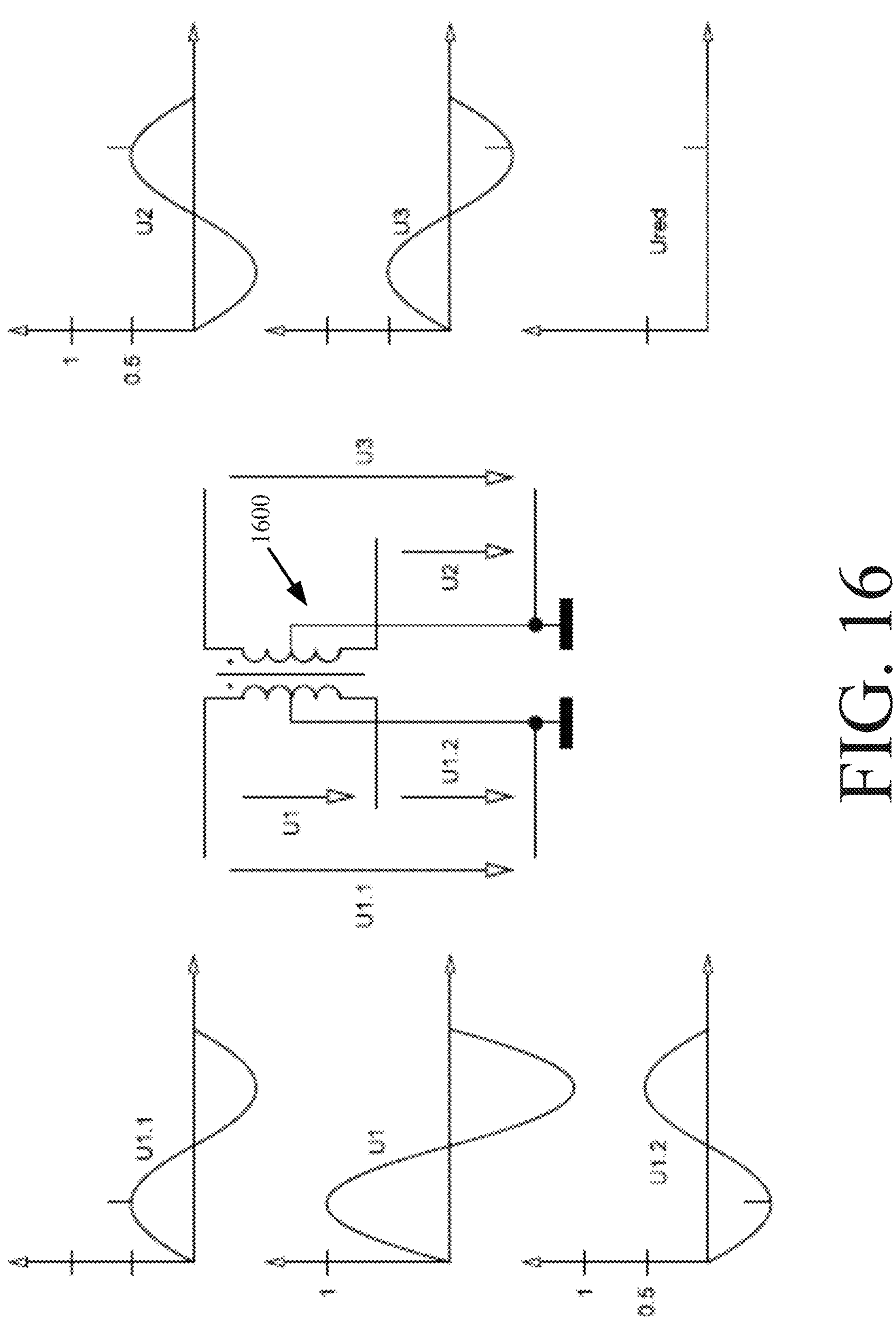

The output of a transformer winding is voltage wise centered around its center tap. This is shown in FIG. 14. This still occurs if there is a common mode disturbance. The common mode disturbance is represented by the blip in FIG. 15. It should be noticed that the ground nodes are meant to be separated here. A common mode voltage on the output (U2, U3) is generated when there is a voltage drop in connection 1600 of FIG. 16.

Even if connections 1700, 1702 of FIG. 17 are relatively short circuit board traces, they will have a resistance and an inductance. Any kind of current flowing therethrough will cause a voltage drop. In the present circuit, current will be present because the local ground nodes are coupled via the switching stages acting as a common mode voltage step function generator. Connections 1700, 1702 are configured to be low-impedant (e.g., having low impedance) at relevant frequencies so that the voltage drop is negligible.

Figure 17A:
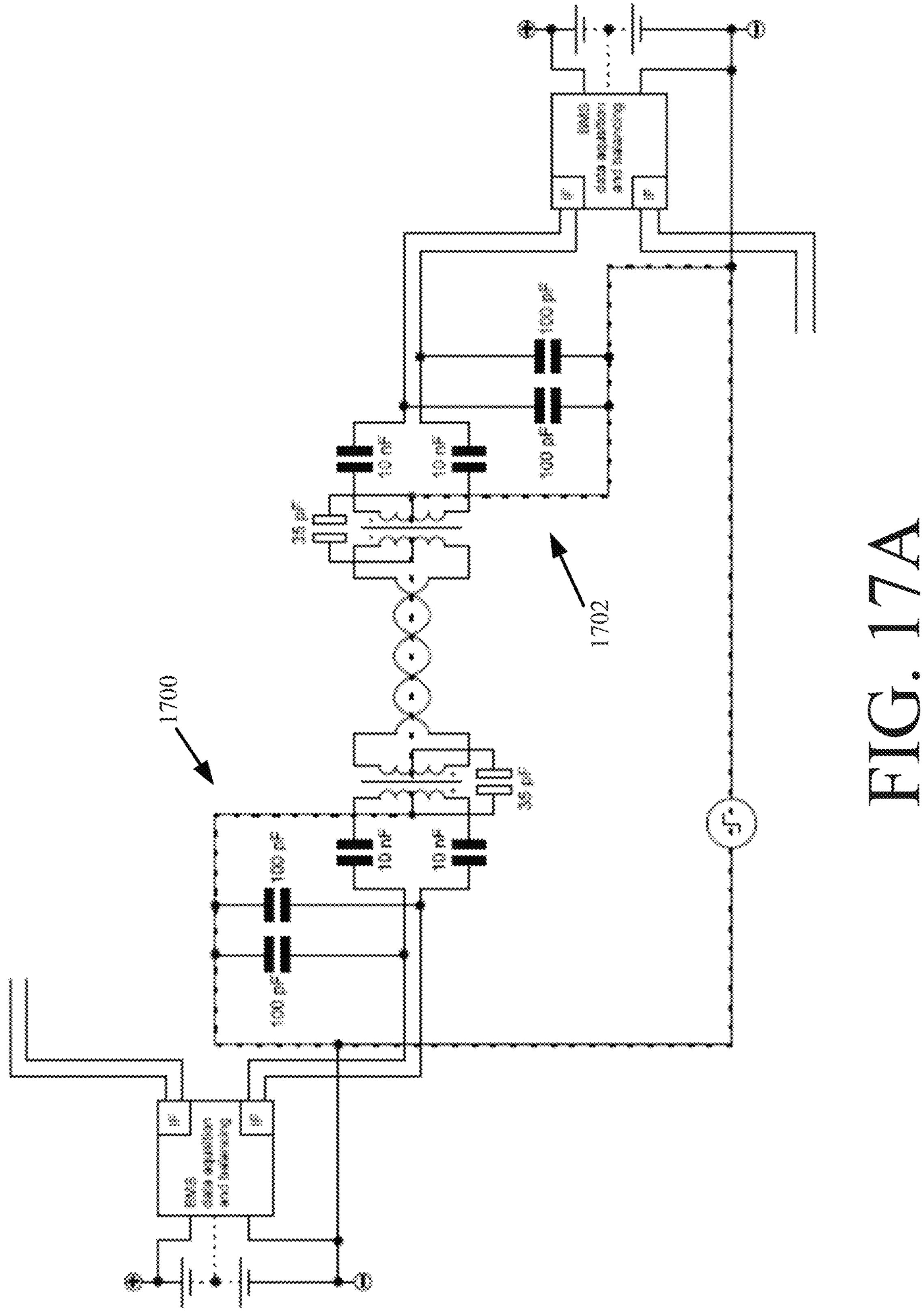

A first solution shown in FIG. 17A provides a direct coupling of the center tap to local ground. In this case, DC blocking capacitors are introduced to DC-wise isolate the transformer form the interface circuit. The DC blocking capacitors may have a capacitance of 10 nF. The present solution is not limited to this particular capacitance value. As non-limiting examples, the DC blocking capacitors may have a capacitance in the range of 1 nanofarad (nF) and 100 nF, for example, 10 nF, 15 nF, 20 nF or 30 nF.

Figure 17B:
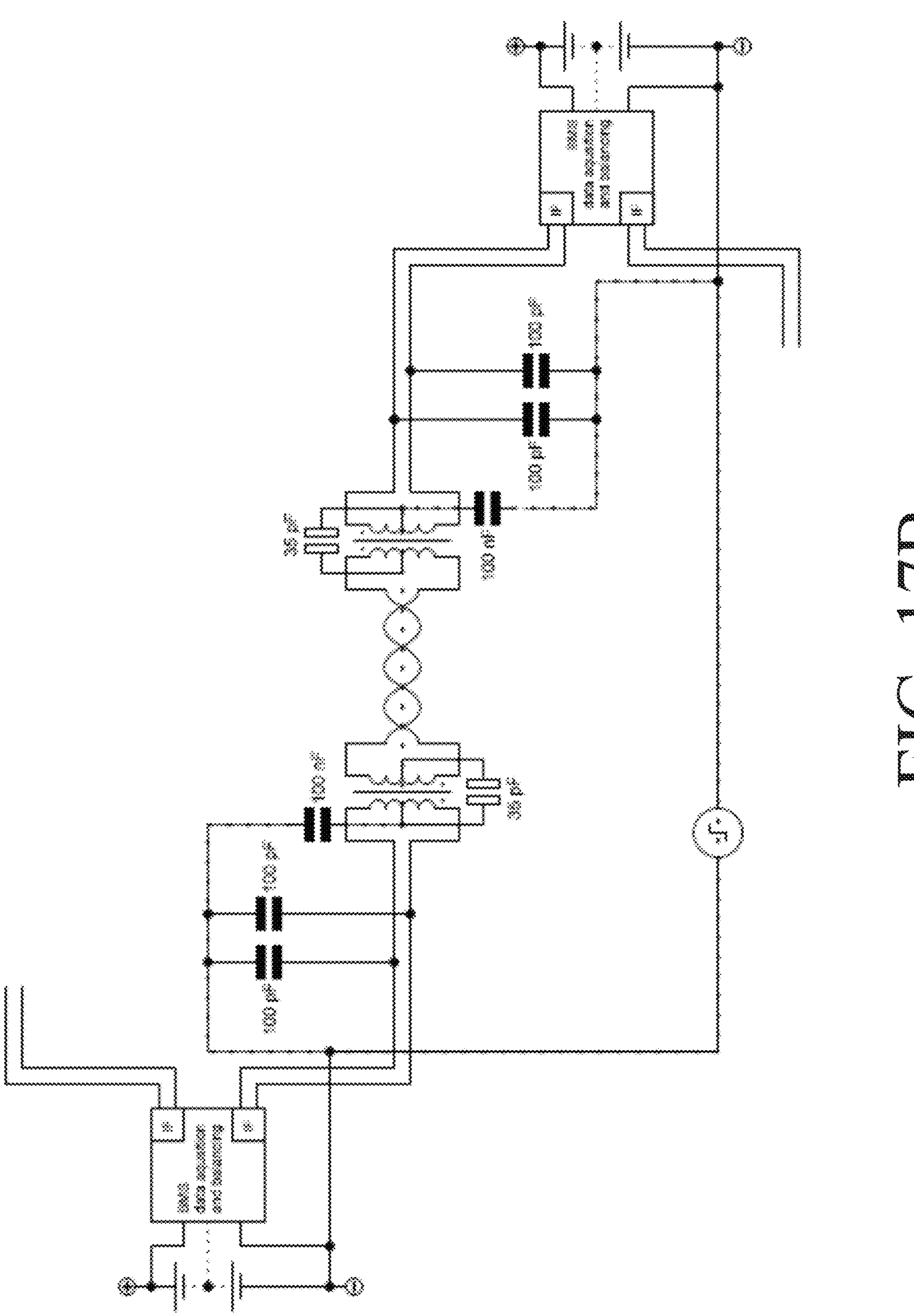

A second solution shown in FIG. 17B provides a larger capacitor (100 nF) to couple the local ground and the center tap of the transformer. The present solution is not limited to this particular capacitance value. As non-limiting examples, the capacitor may have a capacitance in the range of 10 nF-1000 nF, e.g., 50 nF, 75 nF, 100 nF, 150 nF, 200 nF, 250 nF, 300 nF, 400 nF, 500 nF, 600 nF, 700 nF, 800 nF, or 900 nF.

Figure 18:
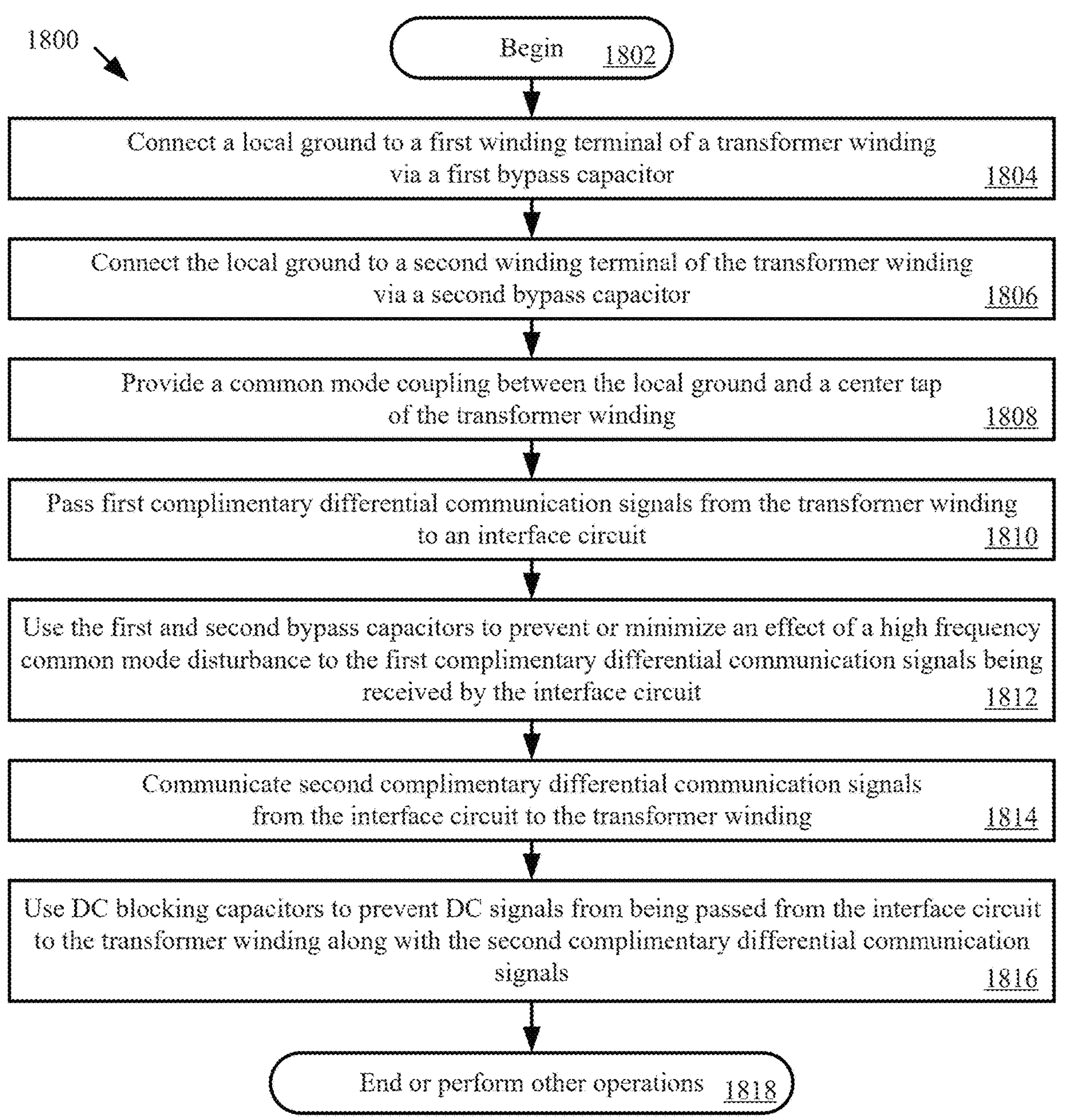
FIG. 18 provides a flow diagram of an illustrative method for operating a circuit in accordance with the present solution.

FIG. 18 provides a flow diagram of an illustrative method 1800 for operating a circuit. Method 1800 begins with 1802 and continues with 1804 in which a local ground (e.g., terminal 692 and/or pin 6 of FIG. 7) is connected to a first winding terminal (e.g., winding terminal 780 of FIG. 7) of a transformer winding (e.g., transformer winding 660 of FIG. 7) via a first bypass capacitor (e.g., bypass capacitor 706 of FIG. 7). In 1806, the local ground is connected to a second winding terminal (e.g., winding terminal 782 of FIG. 7) of the transformer winding (e.g., winding 660 of FIG. 7) via a second bypass capacitor (e.g., bypass capacitor 708 of FIG. 7). A common mode coupling is provided between the local ground and a center tap (e.g., center tap 750 of FIG. 7) of the transformer winding (e.g., winding 660 of FIG. 7), as shown by block 1808.

Next in 1810, first complimentary differential communication signals are passed from the transformer winding (e.g., winding 660 of FIG. 7) to an interface circuit (e.g., interface circuit $484_2$ of FIG. 7). The first and second bypass capacitors (e.g., capacitors 706, 708 of FIG. 7) are used in 1812 to prevent or minimize an effect of a high frequency common mode disturbance to the first complimentary differential communication signals being received by the interface circuit (e.g., interface circuit $484_2$ of FIG. 7). The high frequency common mode disturbance may be caused by a transistor active bridge circuit (e.g., transistor active bridge circuit 450 of FIG. 4) connected to the local ground.

In 1814, second complimentary differential communication signals are communicated from the interface circuit (e.g., interface circuit $484_2$ of FIG. 7) to the transformer winding (e.g., winding 660 of FIG. 7). DC blocking capacitors (e.g., capacitors 702, 704 of FIG. 7) are used in 1816 to prevent DC signals from being passed from the interface circuit (e.g., interface circuit $484_2$ of FIG. 7) to the transformer winding (e.g., winding 660 of FIG. 7) along with the second complimentary differential communication signals.

Subsequently, method 1800 continues to 1818 where it ends or other operations are performed (e.g., return to 1810 or 1814).

Figure 19:
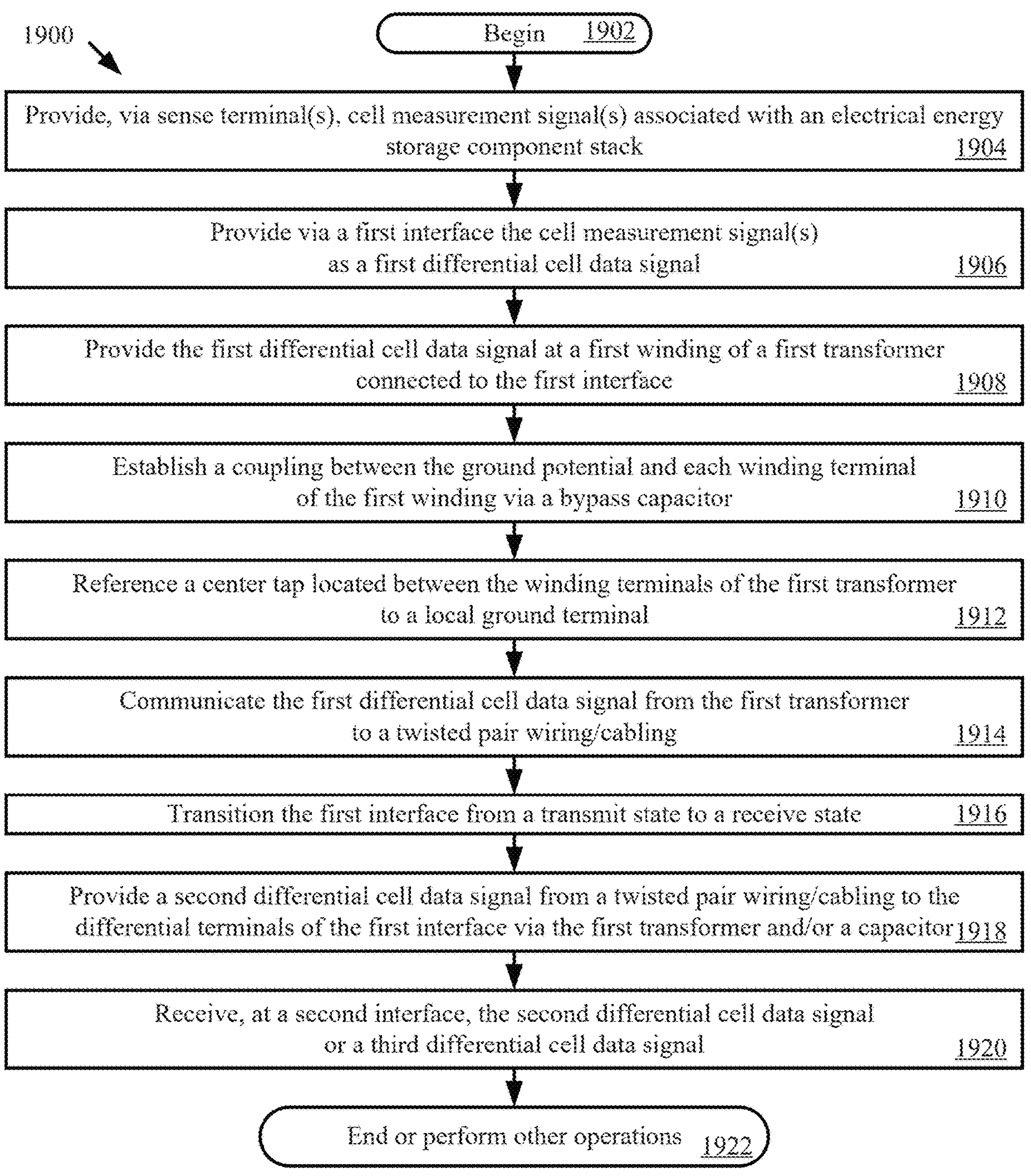
FIG. 19 provides a flow diagram of a method for transmitting cell data of an electrical energy storage component stack comprising a local ground terminal.

FIG. 19 provides a flow diagram of a method 1900 for transmitting cell data of an electrical energy storage component stack (e.g., electrical energy storage component stack 300-2 of FIGS. 6-9) comprising a local ground terminal (e.g., terminal 692 of FIG. 6-9). Method 1900 begins with 1902 and continues with 1904 where operations are performed to provide, via sense terminals (e.g., terminals 690, 693 of FIGS. 6-9), cell measurement signals associated with the electrical energy storage component stack. The cell measurement signals are referenced to a ground potential at a local ground terminal (e.g., terminal 692 of FIGS. 6-9).

In next block 1906, operations are performed to provide via a first interface (e.g., interface circuit 482$_2$ of FIGS. 4-9) the cell measurement signal(s) as a first differential cell data signal. The first interface is in a transmit state and comprises differential terminals (e.g., terminals 1, 2 of FIGS. 6-9). These operations may involve: receiving, at a second interface (e.g., interface circuit 484$_2$ of FIGS. 7-9), a differential cell data signal; and either passing the differential cell data signal as the first differential cell signal to the first interface (482$_2$) or generating the first differential cell signal based on the differential signal. Additionally or alternatively, these operations may involve: obtaining, by the first interface, a half-duplex communication signal in which the cell data is arranged serially, and translate the half-duplex communication signal into the first differential cell data signal comprising a differential communication signal.

The first differential cell data signal is provided at a first winding (e.g., winding 640 of FIGS. 6-9) of a first transformer (e.g., transformer 488$_2$ of FIGS. 6-9) in block 1908. The first transformer is connected to the first interface. In some scenarios, the first differential cell data signal passes through DC blocking capacitors (e.g., capacitors 714, 716 of FIG. 7) prior to being provided at the first winding (640) of the first transformer (488$_2$). In other scenarios, the first differential cell data signal is provided at the first winding (640) of the first transformer (488$_2$) directly from the differential terminals (1, 2) of the first interface (482$_2$). The low-impedance coupling between the center tap (638) and the local ground terminal (692) is a capacitive coupling. The capacitive coupling is provided by a capacitor (e.g., capacitor 902 or 904 of FIG. 9) connected directly to the center tap (e.g., center tap 638 of FIG. 9) of the first winding (e.g., winding 640 of FIG. 9.

As shown by block 1910, a coupling is established between the ground potential and each winding terminal (e.g., windings 790, 792 of FIGS. 7-9) of the first winding (e.g., winding 640 of FIGS. 6-9) via a bypass capacitor (e.g., capacitor 710 or 712 of FIGS. 7-9). The bypass capacitor is disposed between a respective one of the differential terminals (e.g., terminals 1, 2 of FIGS. 7-9) and the local ground terminal (e.g., terminal 692 of FIGS. 7-9).

In 1912, a center tap (e.g., center tap 638 of FIGS. 6-9) located between the winding terminals (e.g., terminals 790, 792 of FIGS. 7-9) of the first transformer (e.g., transformer 488$_2$ of FIGS. 7-9) is referenced to the local ground terminal (e.g., terminal 692 of FIGS. 7-9). This step is performed to: (i) establish a low-impedance coupling between the center tap and the local ground terminal; and (ii) isolate DC potential at the local ground terminal from DC potential of the differential terminals of the first interface. The low-impedance coupling is such that it reduces parasitic voltage drop at the center tap (e.g., center tap 638 of FIGS. 7-9) caused by high-frequency common-mode noise current due to a noise signal transferred via parasitic capacitive coupling (e.g., parasitic capacitive coupling 680 of FIGS. 7-9) between windings (e.g., windings 640, 636 of FIGS. 7-9) of the first transformer (e.g., transformer 488$_2$ of FIGS. 7-9), thereby reducing interference caused by the noise signal in the first differential cell data signal.

In 1914, the first differential cell data signal is communicated from the first transformer to a twisted pair wiring/cabling (e.g., twisted pair wiring/cabling 590 of FIGS. 7-9). The twisted pair wiring/cabling (590) is connected to a second winding (e.g., winding 636 of FIGS. 7-9) of the first transformer.

In 1916, the first interface transitions from the transmit state to a receive state. A second differential cell data signal is provided in 1918 from the twisted pair wiring/cabling to the differential terminals (e.g., terminals 1, 2 of FIGS. 7-9) of the first interface (e.g., interface circuit 482$_2$ of FIGS. 7-9) via exclusively the first transformer or via the first transformer and a capacitor (e.g., capacitor 714 and/or 716 of FIG. 7). In 1920, the second different cell data signal or a third differential cell data signal is received at the second interface. Subsequently, method 1900 continues to block 1922 where it ends or other operations are performed.

Figure 20:
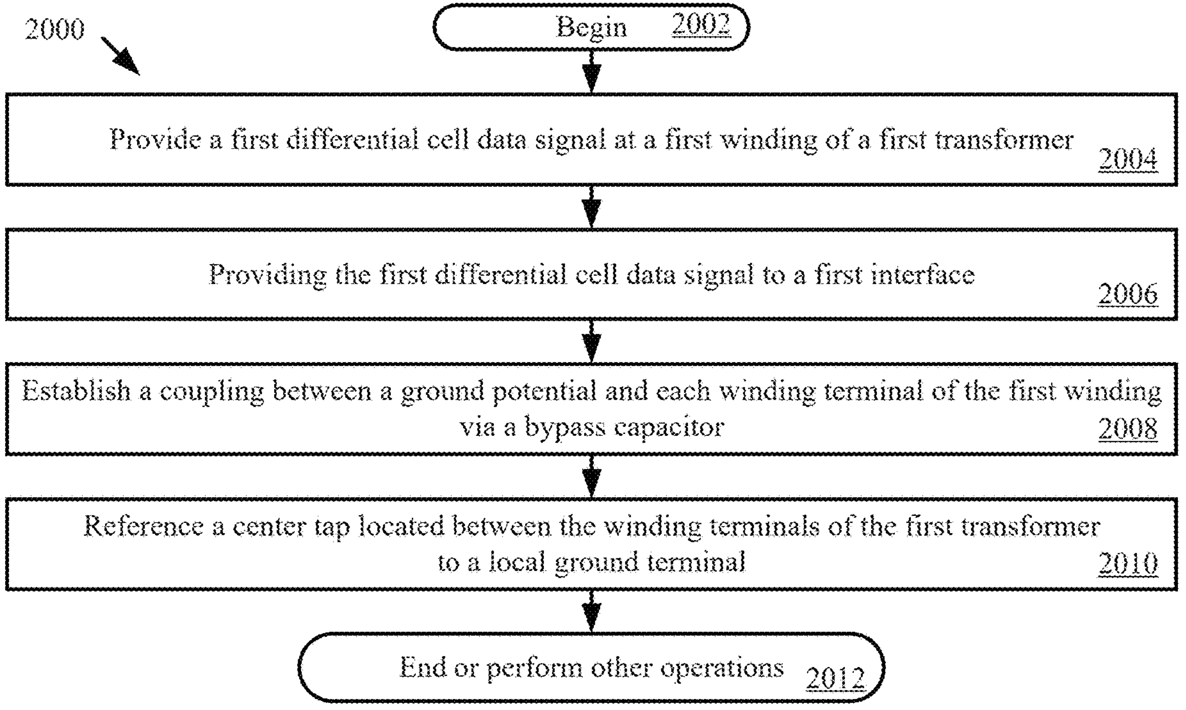
FIG. 20 provides a flow diagram of a method for receiving cell data of an electrical energy storage component stack comprising a local ground terminal.

FIG. 20 provides a flow diagram of a method 2000 for receiving cell data of an electrical energy storage component stack (e.g., electrical energy storage component stack 300$_2$ of FIGS. 6-9) comprising a local ground terminal (e.g., terminal 692 of FIGS. 6-9). Method 2000 begins with 2002 and continues with 2004 where a first differential cell data signal is provided at a first winding (e.g., winding 640 of FIGS. 7-9) of a first transformer (e.g., e.g., transformer 488$_2$ of FIGS. 7-9). The first transformer is connected to a first interface (e.g., interface 482$_2$ of FIGS. 7-9). The first differential cell data signal is provided to the first interface in block 2006. The first interface is in a receive state and comprises differential terminals (e.g., terminals 1, 2 of FIGS. 7-9).

In 2008, a coupling is established between a ground potential and each winding terminal (e.g., winding terminals 790, 792 of FIGS. 7-9) of the first winding via a bypass capacitor (e.g., capacitor 710, 712, 910 or 912 of FIGS. 7 and 9). The bypass capacitor is disposed between a respective one of the differential terminals and a local ground terminal (e.g., terminal 692 of FIGS. 7-9).

A center tap (e.g., center tap 638 of FIGS. 7-9) is located between the winding terminals (e.g., winding terminals 790, 792 of FIGS. 7-9) of the first transformer. The center tap is references to the local ground terminal in 2010. This is done to: establish a low-impedance coupling between the center tap and the local ground terminal; and isolate a DC potential at the local ground terminal from DC potential of the differential terminals. The low-impedance coupling is such that it reduces parasitic voltage drop at the center tap caused by high-frequency common-mode noise current due to a noise signal transferred via parasitic capacitive coupling (e.g., parasitic capacitive coupling 680 of FIGS. 7-9) between windings (e.g., windings 640, 636 of FIGS. 7-9) of the first transformer, thereby reducing interference caused by the noise signal in the differential cell data signal.

Subsequently, method 2000 continues to block 2012 where it ends or other operations are performed. These other operations can include, but are not limited to: passing the first differential cell data signal from the first interface (e.g., interface circuit 482$_2$ of FIGS. 7-9) to a second interface (e.g., interface circuit 484$_2$ of FIGS. 7-9) or generating a second differential cell data signal based on the first differential cell data signal. The first differential cell data signal may be provided from a twisted pair wiring/cabling (590) to the differential terminals of the first interface via exclusively the first transformer or via the first transformer and a capacitor.

It shall be appreciated that the present teachings can also provide systems comprising means for performing the herein disclosed methods (e.g., any of the herein disclosed method steps).

Furthermore, the present teachings can also provide software products comprising instructions which when executed by a suitable system (e.g., processor or circuit) cause the system to perform the herein disclosed methods (e.g., any of the herein disclosed method steps).

The present teachings can thus provide systems, methods and software products comprising: providing cell measurement signals (CMs) associated with electrical energy storage component stack (CMs are referenced to ground potential (GP) at a local ground terminal (LGT)); providing via a first interface (FI) CM(s) as a first differential cell data signal (FDCDS) (wherein FI comprises differential terminals (DTs); providing FDCDS at a first winding (FW) of a first transformer (FT) connected to FI; establishing a coupling between GP and each terminal of FW via a bypass capacitor (BC) disposed between a DT and LGT; and referencing a center tap (CT) located between FT's winding terminals to LGT to establish a low-impedance coupling between CT and LGT, and isolate DC potential at LGT from DC potential of DTs. The low-impedance coupling is such that it reduces parasitic voltage drop at CT caused by high-frequency common-mode noise current due to noise signal transferred via parasitic capacitive coupling between FT's windings.

Although the present solution has been illustrated and described with respect to one or more implementations, equivalent alterations and modifications will occur to others skilled in the art upon the reading and understanding of this specification and the annexed drawings. In addition, while a particular feature of the present solution may have been disclosed with respect to only one of several implementations, such feature may be combined with one or more other features of the other implementations as may be desired and advantageous for any given or particular application. Thus, the breadth and scope of the present solution should not be limited by any of the above described scenarios. Rather, the scope of the present solution should be defined in accordance with the following claims and their equivalents.

Without excluding further possible embodiments, certain example embodiments are summarized in the following clauses.

Clause 1: A method for transmitting cell data of an electrical energy storage component stack (300-2) comprising a local ground terminal (692), the method comprising: providing, via a plurality of sense terminals (690, 693), a plurality of cell measurement signals associated with the electrical energy storage component stack (300-2) (wherein the plurality of cell measurement signals are referenced to a ground potential at a local ground terminal (692)); providing via a first interface ($482_2$) at least some of the plurality of cell measurement signals as a first differential cell data signal (wherein the first interface ($482_2$) is in a transmit state and comprises differential terminals (1, 2)); providing the first differential cell data signal at a first winding (640) of a first transformer ($488_2$) connected to the first interface ($482_2$); establishing a coupling between the ground potential and each winding terminal (790, 792) of the first winding (640) via a bypass capacitor (710, 712) disposed between a respective one of the differential terminals (1, 2) and the local ground terminal (692); referencing a center tap (638) located between the winding terminals (790, 792) of the first transformer ($488_2$) to the local ground terminal (692) so as to establish a low-impedance coupling between the center tap (638) and the local ground terminal (692), and isolate DC potential at the local ground terminal (692) from DC potential of the differential terminals (1, 2); wherein the low-impedance coupling is such that it reduces parasitic voltage drop at the center tap (638) caused by high-frequency common-mode noise current due to a noise signal transferred via parasitic capacitive coupling (680) between windings (640, 636) of the first transformer ($488_2$), thereby reducing interference caused by the noise signal in the first differential cell data signal.

Clause 1a: A method for transmitting cell data of an electrical energy storage component stack (e.g., $300_2$) comprising a local ground terminal (e.g., 692), the method comprising:

- providing, via a plurality of sense terminals (e.g., terminals 690, 693), a plurality of cell measurement signals associated with the electrical energy storage component stack (e.g., 300, $300_2$, $302_2$), wherein the plurality of cell measurement signals are referenced to a ground potential at a local ground terminal (e.g., 692);
- providing via a first interface (e.g., $482_2$) at least some of the plurality of cell measurement signals as a first differential cell data signal, wherein the first interface (e.g., $482_2$) is in a transmit state and comprises differential terminals (e.g., 1, 2);
- providing the first differential cell data signal at a first winding (e.g., 640) of a first transformer (e.g., $488_2$) connected via DC block capacitors (e.g., 714, 716) to the first interface (e.g., $482_2$);
- establishing a coupling between the local ground terminal (e.g., 692) and each of the differential terminals (e.g., 1, 2) (e.g., of the first interface (e.g., $482_2$)) via a bypass capacitor disposed between a respective one of the differential terminals (e.g., 1, 2) and the local ground terminal (e.g., 692);
- referencing a center tap (e.g., 638) located between the winding terminals (e.g., 790, 792) of the first transformer (e.g., $488_2$) to the local ground terminal (e.g., 692) via a conductive connection (so as to establish a low-impedance (e.g., a wideband low-impedance) coupling between the center tap and the local ground terminal.) (It shall be appreciated that the low-impedance coupling as provided by the low-ohmic (e.g., a direct connection) reduces parasitic voltage drop at the center tap caused by high-frequency common-mode noise current due to a noise signal transferred via parasitic capacitive coupling (e.g., 680) between windings of the first transformer, thereby reducing interference caused by the noise signal in the first differential cell data signal.)

Clause 2: The method of Clause 1 or Clause 1a, further comprising passing the first differential cell data signal through DC blocking capacitors (714, 716) prior to said providing the first differential cell data signal at the first winding (640) of the first transformer ($488_2$).

Clause 3: The method according to any of the proceeding Clauses, wherein said first differential cell data signal is provided at the first winding (640) of the first transformer ($488_2$) directly from the differential terminals (1, 2) of the first interface ($482_2$).

Clause 4: The method according to any of the proceeding Clauses, wherein the low-impedance coupling between the center tap (638) and the local ground terminal (692) is a capacitive coupling.

Clause 5: The method according to any of the proceeding Clauses, wherein the capacitive coupling is provided by a capacitor connected directly to the center tap of the first winding.

Clause 5a: The method according to any of the proceeding Clauses, wherein the low-impedance coupling between the center tap and the local ground terminal is (e.g., provided via) a low-impedance conductive connection.

Clause 5b: The method according to Clause 5a, wherein the conductive coupling is provided by a direct connection between the center tap and the local ground terminal.

Clause 6: The method according to any of the proceeding Clauses, further comprising performing operations by the first interface (482$_2$) to obtain a duplex communication signal in which the cell data is arranged serially, and translate the duplex communication signal into the first differential cell data signal comprising a differential communication signal.

Clause 7: The method according to any of the proceeding Clauses, further comprising communicating the first differential cell data signal from the first transformer (488$_2$) to a twisted pair wiring/cabling (590).

Clause 8: The method according to any of the proceeding Clauses, wherein the twisted pair wiring/cabling (590) is connected to a second winding (636) of the first transformer (488$_2$).

Clause 9: The method according to any of the proceeding Clauses, further comprising transitioning the first interface (482$_2$) from the transmit state to a receive state.

Clause 10: The method according to any of the proceeding Clauses, comprising providing a third differential cell data signal from a twisted pair wiring/cabling (590) to the differential terminals (1, 2) of the first interface (482$_2$) via exclusively the first transformer (488$_2$).

Clause 11: The method according to any of the proceeding Clauses, further comprising further comprising providing a third differential cell data signal from a twisted pair wiring/cabling (590) to the differential terminals (1, 2) of the first interface (482$_2$) via the first transformer (488$_2$) and a capacitor.

Clause 12: The method according to any of the proceeding Clauses, further comprising receiving, at a second interface (484$_2$), a differential cell data signal, and either passing the differential cell data signal as the first differential cell signal to the first interface (482$_2$) or generating the first differential cell signal based on the second differential signal.

Clause 13: An energy storage module comprising a circuit configured to perform the method according to any of the proceeding Clauses.

Clause 14: A power supply unit comprises a plurality of energy storage modules connected in a daisy chain, wherein each of the plurality of energy storage modules comprises a circuit configured to perform the method according to any of the proceeding Clauses.

Clause 15: A method for receiving cell data of an electrical energy storage component stack (e.g., 302$_2$) comprising a local ground terminal (e.g., 692), the method comprising: providing a first differential cell data signal at a first winding (e.g., 640) of a first transformer (e.g., 488$_2$) connected to a first interface (e.g., 482$_2$); providing the first differential cell data signal to the first interface (e.g., 482$_2$) (wherein the first interface (e.g., 482$_2$) is in a receive state and comprises differential terminals (e.g., 1, 2)); establishing a coupling between a ground potential and each winding terminal (e.g., 790, 792) of the first winding (e.g., 640) via a bypass capacitor (e.g., 710, 712) disposed between a respective one of the differential terminals (e.g., 1, 2) and a local ground terminal (e.g., 692); referencing a center tap (e.g., 638) located between the winding terminals (e.g., 790, 792) of the first transformer (e.g., 488$_2$) to the local ground terminal (e.g., 692) so as to establish a low-impedance coupling between the center tap (e.g., 638) and the local ground terminal (e.g., 692), and isolate DC potential at the local ground terminal (e.g., 692) from DC potential of the differential terminals (e.g., 1, 2); wherein the low-impedance coupling is such that it reduces parasitic voltage drop at the center tap (e.g., 638) caused by high-frequency common-mode noise current due to a noise signal transferred via parasitic capacitive coupling (e.g., 680) between windings (e.g., 640, 636) of the first transformer (e.g., 488$_2$), thereby reducing interference caused by the noise signal in the differential cell data signal.

Clause 15a: A method for receiving cell data of an electrical energy storage component stack (e.g., 302$_2$ or 300$_2$) comprising a local ground terminal (e.g., 692), the method comprising:

- providing a first differential cell data signal at a first winding (e.g., 640) of a first transformer (e.g., 488$_2$) connected via DC block capacitors (e.g., 714, 716) to the first interface (e.g., 482$_2$) (wherein the first interface (e.g., 482$_2$) is in a receive state and comprises differential terminals (e.g., 1, 2));
- establishing a coupling between the local ground terminal (e.g., 692) and each of the differential terminals (e.g., 1, 2) (of the first interface) via a bypass capacitor (e.g., 710, 712) disposed between a respective one of the differential terminals and the local ground terminal (e.g., 692);
- referencing a center tap (e.g., 638) located between the winding terminals (790, 792) of the first transformer (e.g., 488$_2$) to the local ground terminal (e.g., 692) via a conductive connection (so as to: establish a low-impedance (e.g., a wideband low-impedant) coupling between the center tap and the local ground terminal. (It shall be appreciated that the low-impedance coupling as provided by the low-ohmic (e.g., a direct connection, e.g., between 638 and 692) reduces parasitic voltage drop at the center tap caused by high-frequency common-mode noise current due to a noise signal transferred via parasitic capacitive coupling between windings of the first transformer, thereby reducing interference caused by the noise signal in the first differential cell data signal.)

Clause 16: The method according to Clause 15 or Clause 15a, further comprising passing the first differential cell data signal from the first interface (482$_2$) to a second interface (484$_2$) or generating a second differential cell data signal based on the first differential cell data signal.

Clause 17: The method according to any of the proceeding Clauses, wherein the first differential cell data signal is provided from a twisted pair wiring/cabling (590) to the differential terminals (1, 2) of the first interface (482$_2$) via exclusively the first transformer (488$_2$).

Clause 18: The method according to any of the proceeding Clauses, wherein the first differential cell data signal is provided from a twisted pair wiring/cabling (590) to the differential terminals (1, 2) of the first interface (482$_2$) via the first transformer (488$_2$) and a capacitor.

Clause 19: The method according to any preceding Clauses, further comprising using one or more DC blocking capacitors (714, 716) to prevent DC signals from being transmitted along with the first differential cell data signal from the first interface (482$_2$) to the first transformer.

Clause 19a: The method according to any preceding method Clauses, further comprising using one or more DC blocking capacitors to prevent DC (e.g., DC signals, e.g., common-mode voltage] from being transmitted with the first differential cell data signal propagating between the first interface and the first transformer (e.g., differential cell data signal from the first interface to the first transformer).

Clause 20: The method according to any preceding Clauses, further comprising electrically connecting both the first interface and the second interface to the local ground terminal.

Clause 20a: The method according to any preceding method Clauses, wherein the differential terminals include a first differential terminal (1) and a second differential terminal (2), and the method further comprises: capacitively decoupling both the first differential terminal (1) and the second differential terminal (2) to the local ground terminal (692), (e.g., via decoupling capacitors (710, 712).

Clause 21: An energy storage module comprising a circuit configured to perform the method according to according to any of the proceeding Clauses.

Clause 22: A power supply unit comprises a plurality of energy storage modules connected in a daisy chain, wherein each of the plurality of energy storage modules comprises a circuit configured to perform the method according to according to any of the proceeding Clauses.

Clause 23: A battery management system (BMS) circuit, comprising: a plurality of terminals (690, 692) configured to facilitate measurement of voltages of an electrical energy storage stack (500), wherein at least one of the terminals (692) forms a local ground for the BMS circuit; a first transformer ($\mathbf{486_2}$) having a first winding (662) and a second winding (660), the first winding (662) has a first center tap (760) and the second winding (660) has a second center tap (750); a second transformer ($\mathbf{488_2}$) having a third winding (636) and a fourth winding (640), the third winding (636) has a third center tap (770) and the fourth winding (640) has a fourth center tap (638); a first interface circuit ($\mathbf{484_2}$) connected to the second winding (660); a second interface circuit ($\mathbf{482_2}$) connected to the fourth winding (640); a common-mode coupling between local ground and each of the second center tap (750) and the fourth center tap (638); at least one first bypass capacitor (706 or 708) connected to a winding terminal (780 or 782) of the second winding (660) of the first transformer ($\mathbf{486_2}$), wherein the at least one first bypass capacitor (706 or 708) connects the local ground to the winding terminal (780 or 782) of the second winding (660); and/or at least one second bypass capacitor (710 or 712) connected to a winding terminal (790 or 792) of the fourth winding (640) of the second transformer ($\mathbf{488_2}$), wherein the at least one second bypass capacitor (710 or 712) connects local ground to the winding terminal (790 or 792) of the fourth winding (640).

Clause 23a: A battery management system (BMS) circuit, comprising: a plurality of terminals (e.g., 690, 692, 693) configured to facilitate measurement of voltages of an electrical energy storage stack (e.g., 300, $\mathbf{302_2}$, 500), wherein at least one of the terminals (e.g., 692) forms a local ground for the BMS circuit; a first transformer (e.g., $\mathbf{486_2}$) comprising a first winding (e.g., 662) and a second winding (e.g., 660), wherein the first winding (e.g., 662) has a first center tap (e.g., 760) and the second winding (e.g., 660) has a second center tap (e.g., 750); a second transformer (e.g., $\mathbf{488_2}$) having a third winding (e.g., 636) and a fourth winding (e.g., 640), wherein the third winding (e.g., 636) has a third center tap (e.g., 770) and the fourth winding (e.g., 640) has a fourth center tap (e.g., 638); a first interface circuit (e.g., $\mathbf{484_2}$) comprising differential terminals (e.g., 3, 4) connected to the second winding (e.g., 660) of the first transformer (e.g., $\mathbf{486_2}$) via a first set of DC block capacitors (e.g., 702, 704); a second interface circuit (e.g., $\mathbf{482_2}$) comprising differential terminals (e.g., 1, 2) connected to the fourth winding (e.g., 640) of the second transformer (e.g., $\mathbf{488_2}$) via a second set of DC block capacitors (e.g., 714, 716); a common-mode coupling between local ground terminal (e.g., 692) and each of the second center tap (e.g., 760) and the fourth center tap (e.g., 638) via a conductive (e.g., wideband low-impedant) connection; at least one first bypass capacitor (e.g., 706,708) connected between each of differential terminals (e.g., 3, 4 respectively) of the first interface circuit (e.g., $\mathbf{484_2}$) and the local ground terminal (e.g., 692); at least one first bypass capacitor (e.g., 710,712) connected between each of differential terminals (e.g., 1, 2 respectively) of the second interface circuit (e.g., $\mathbf{482_2}$) and the local ground terminal (e.g., 692). Wherein the conductive connection is such that it establishes a low-impedance (e.g., a wideband low-impedance) coupling between the respective center taps and the local ground terminal (e.g., 692). (It shall be appreciated that the low-impedance coupling as provided by the low-ohmic (e.g., a direct connection, e.g., with) reduces parasitic voltage drop at the center tap caused by high-frequency common-mode noise current due to a noise signal transferred via parasitic capacitive coupling between windings of the first transformer (e.g., $\mathbf{486_2}$) and/or the second transformer (e.g., $\mathbf{488_2}$), thereby reducing interference caused by the noise signal in the differential cell data signals at the first interface and/or the second interface.)

Clause 24: The BMS circuit according to Clause 23 or Clause 23a, wherein the second winding (660) comprises a first winding terminal (780) and a second winding terminal (782), and the winding terminal of the second winding (660) to which the at least one first bypass capacitor (706) is connected comprises the first winding terminal (780).

Clause 25: The BMS circuit according to any of the proceeding Clauses, further comprising a DC blocking capacitor (704) connected between the first interface circuit ($\mathbf{484_2}$) and the first winding terminal (780) of the second winding (660) of the first transformer ($\mathbf{486_2}$) so as to prevent DC signals from being passed from the first interface circuit ($\mathbf{484_2}$) to the first transformer ($\mathbf{486_2}$).

Clause 26: The BMS circuit according to any of the proceeding Clauses, wherein another bypass capacitor is connected to the second winding terminal (782) of the second winding (660) of the first transformer ($\mathbf{486_2}$).

Clause 27: The BMS circuit according to any of the proceeding Clauses, further comprising a DC blocking capacitor (702) connected between the first interface circuit ($\mathbf{484_2}$) and the second winding terminal (782) of the second winding (660) of the first transformer ($\mathbf{486_2}$) so as to prevent DC signals from being passed from the first interface circuit ($\mathbf{484_2}$) to the first transformer ($\mathbf{486_2}$).

Clause 28: The BMS circuit according to any of the proceeding Clauses, wherein the fourth winding (640) comprises a first winding terminal (790) and a second winding terminal (792), and the winding terminal of the fourth winding (640) to which the at least one second bypass capacitor (710) is connected comprises the first winding terminal (790).

Clause 29: The BMS circuit according to any of the proceeding Clauses, further comprising a DC blocking capacitor (714) connected between the second interface circuit ($\mathbf{482_2}$) and the first winding terminal (790) of the fourth winding (640) of the second transformer ($\mathbf{488_2}$), wherein the DC blocking capacitor (714) is configured to prevent DC signals from being passed from the second interface circuit (482$_2$) to the second transformer (488$_2$).

Clause 30: The BMS circuit according to any of the proceeding Clauses, wherein another bypass capacitor is connected to the second winding terminal (792) of the fourth winding (640) of the second transformer (488$_2$).

Clause 31: The BMS circuit according to any of the proceeding Clauses, further comprising a DC blocking capacitor (716) connected between the second interface circuit (482$_2$) and the second winding terminal (792) of the fourth winding (640) of the second transformer (488$_2$), wherein the DC blocking capacitor (716) is configured to prevent DC signals from being passed from the second interface circuit (482$_2$) to the second transformer (488$_2$).

Clause 32: The BMS circuit according to any of the proceeding Clauses, further comprising a first dual purpose capacitor (902) connected between the local ground and the second center tap (750) of second winding (660) of first transformer (486$_2$).

Clause 33: The BMS circuit according to any of the proceeding Clauses, further comprising a second dual purpose capacitor (904) connected between local ground and the fourth center tap (638) of the fourth winding (640) of the second transformer (488$_2$).

Clause 34: The BMS circuit according to any of the proceeding Clauses, wherein each of the first and second dual purpose capacitors (902, 904) is configured to (i) prevent DC signals from being transmitted from a respective one of the first and second interfaces (484$_2$, 482$_2$) when transmitting data and (ii) bypass a common mode current to local ground.

Clause 35: The BMS circuit according to any of the proceeding Clauses, wherein the local ground is connected to a transistor active bridge circuit (450) which causes a high frequency common mode disturbance in data communications of the first interface (484$_2$) and/or second interface (482$_2$).

Clause 36: The BMS circuit according to any of the proceeding Clauses, wherein each of the at least one first bypass capacitor (706 or 708) and the at least one second bypass capacitor (710 or 712) is configured to prevent or minimize an effect of the high frequency common mode disturbance on data being communicated via the data communications.

Clause 37: The BMS circuit according to any of the proceeding Clauses, wherein the at least one first bypass capacitor (706 or 708) and the at least one second bypass capacitor (710 or 712) have a same capacitance.

Clause 38: The BMS circuit according to any of the proceeding Clauses, wherein each of the first and second interfaces (484$_2$, 482$_2$) is configured to receive or generate a duplex communication signal in which the sensor data is arranged serially, and translate the duplex communication signal into a differential communication signal.

Clause 39: The BMS circuit according to any of the proceeding Clauses, further comprising a first twisted pair wire or cable (590) connected to the first winding (662) of the first transformer (486$_2$) and a second twisted pair wire or cable (590) connected to the third winding (636) of the second transformer (488$_2$).

Clause 40: A method for operating a circuit, comprising: connecting a local ground to a first winding terminal (780) of a transformer winding (660) via a first bypass capacitor (706); connecting the local ground to a second winding terminal (782) of the transformer winding (660) via a second bypass capacitor (708); providing a common mode coupling between the local ground and a center tap (750) of the transformer winding (660); passing first complimentary differential communication signals from the transformer winding (660) to an interface circuit (484$_2$); and using the first and second bypass capacitors (706, 708) to prevent or minimize an effect of a high frequency common mode disturbance to the first complimentary differential communication signals being received by the interface circuit (484$_2$).

Clause 40a: A method for operating a circuit, comprising: providing a conductive connection between a local ground (692) (e.g., of the circuit) to a center tap (750) of a transformer winding (660) (e.g., the center tap (750) located between first winding terminal (780) and second winding terminal (782)) (e.g., for providing a common mode coupling between the local ground (692) and the center tap (750)); providing a first signal coupling between a first winding terminal (780) of the transformer winding (660) and a first differential terminal (4) of an interface circuit (484$_2$) via a first DC blocking capacitor (704); providing a second coupling between a second winding terminal (782) of the transformer winding (660) and a first differential terminal (3) of an interface circuit (484$_2$) via a second DC blocking capacitor (702); providing a connection between the local ground (692) and first differential terminal (4) via a first bypass capacitor (706); providing a connection between the local ground (692) and the second differential terminal (3) via a second bypass capacitor (708); passing first complimentary differential communication signals between (e.g., to or from) the transformer winding (660) and the interface circuit (484$_2$); and using the first and second bypass capacitors (706, 708) to prevent or minimize an effect of a high frequency common mode disturbance to the first complimentary differential communication signals at (e.g., being received by) the interface circuit (484$_2$).

Clause 41: The method according to Clause 40 or Clause 40a, wherein the high frequency common mode disturbance is caused by a transistor active bridge circuit (450) connected to the local ground.

Clause 42: The method according to Clause 40 and/or Clause 40a and/or Clause 41, further comprising communicating second complimentary differential communication signals from the interface circuit (484$_2$) to the transformer winding (660); and using DC blocking capacitors to prevent DC signals from being passed from the interface circuit (484$_2$) to the transformer winding (660) along with the second complimentary differential communication signals.

Clause 43: The method according to any preceding method Clauses, wherein a bypass capacitance is in a range of 33 pF to 330 pF, preferably in a range of 47 pF to 220 pF (more preferably e.g., 100 pF), and a DC blocking capacitance is in a range of: 1 nF and 100 nF, preferably in a range of 5 nF and 15 nF (more preferably e.g., 10 nF).

Clause 44: The method according to any preceding method Clauses, wherein first interface (482$_2$) is coupled to the first winding (640) of the first transformer (488$_2$) via DC blocking capacitors (714, 716), and or the method further comprises using the DC blocking capacitors (714, 716) to prevent DC signals from being transmitted between the first interface (482$_2$) and the first transformer (488$_2$).

Clause 45: The method according to any preceding method Clauses, wherein the electrical energy storage component stack is part of an electrical inverter (preferably a multi-level inverter).

Clause 46: The method according to any preceding method Clauses, wherein the first interface (482$_2$) and/or the second interface (484$_2$) are isoSPI interface (or its derivates or likes).

Clause 47: System comprising means for performing the steps of any of the above clauses.

Clause 48: A software product comprising instructions which when executed by a suitable system (e.g., a processor or circuit), causes the system to perform the steps of any of the above clauses.

Clause 49: A circuit, or an energy storage module comprising the circuit, configured to perform the method according to any of the above Clauses.

Clause 50: A power supply unit comprising a plurality of energy storage modules connected in a daisy chain, wherein each of the plurality of energy storage modules comprises a circuit configured to perform the method according to any of the above Clauses.

The breadth and scope of this disclosure should not be limited by any of the above-described example embodiments, but should be defined only in accordance with the following claims and their equivalents.

The invention claimed is:

1. A method for transmitting cell data of an electrical energy storage component stack comprising a local ground terminal, the method comprising:

providing, via a plurality of sense terminals, a plurality of cell measurement signals associated with the electrical energy storage component stack, wherein the plurality of cell measurement signals are referenced to a ground potential at a local ground terminal;

providing via a first interface at least some of the plurality of cell measurement signals as a first differential cell data signal, wherein the first interface is in a transmit state and comprises differential terminals;

passing the first differential cell data signal through DC blocking capacitors;

providing the first differential cell data signal at a first winding of the first transformer connected via the DC blocking capacitors to the first interface;

establishing a coupling between the local ground terminal and each of the differential terminals via a bypass capacitor disposed between a respective one of the differential terminals and the local ground terminal;

referencing a center tap located between the winding terminals of the first transformer via a conductive connection between the center tap and the local ground terminal.

2. The method according to claim 1, wherein said first differential cell data signal is provided at the first winding of the first transformer directly from the differential terminals of the first interface.

3. The method according to claim 1, wherein the low-impedance coupling between the center tap and the local ground terminal is a low-impedance conductive connection.

4. The method according to claim 3, wherein the conductive connection coupling is provided by a direct connection between the center tap and the local ground terminal.

5. The method according to claim 1, further comprising performing operations by the first interface to obtain a duplex communication signal in which the cell data is arranged serially, and translate the duplex communication signal into the first differential cell data signal comprising a differential communication signal.

6. The method according to claim 1, further comprising communicating the first differential cell data signal from the first transformer to a twisted pair wiring/cabling.

7. The method according to claim 6, wherein the twisted pair wiring/cabling is connected to a second winding of the first transformer.

8. The method according to claim 1, further comprising transitioning the first interface from the transmit state to a receive state.

9. The method according to claim 8, further comprising providing a third differential cell data signal from a twisted pair wiring/cabling to the differential terminals of the first interface via the first transformer and a capacitor.

10. The method according to claim 1, further comprising receiving, at a second interface, a differential cell data signal, and either passing the differential cell data signal as the first differential cell signal to the first interface or generating the first differential cell signal based on the second differential signal.

11. A method for receiving cell data of an electrical energy storage component stack comprising a local ground terminal, the method comprising:

passing a first differential cell data signal through DC blocking capacitors;

providing the first differential cell data signal at a first winding of the first transformer connected via the DC blocking capacitors to a first interface;

providing the first differential cell data signal to the first interface, wherein the first interface is in a receive state and comprises differential terminals;

establishing a coupling between the local ground terminal and each of the differential terminals via a bypass capacitor disposed between a respective one of the differential terminals and the local ground terminal;

referencing a center tap located between the winding terminals of the first transformer to the local ground terminal so as to:

establish a low-impedance coupling between the center tap and the local ground terminal;

wherein the low-impedance coupling is such that it reduces parasitic voltage drop at the center tap caused by high-frequency common-mode noise current due to a noise signal transferred via parasitic capacitive coupling between windings of the first transformer, thereby reducing interference caused by the noise signal in the differential cell data signal.

12. A circuit, or an energy storage module comprising the circuit, configured to perform the method according to claim 1.

13. A power supply unit comprising a plurality of energy storage modules connected in a daisy chain, wherein each of the plurality of energy storage modules comprises a circuit configured to perform the method of claim 1.

14. The method according to claim 1, further comprising using one or more of the DC blocking capacitors to prevent DC from being transmitted with the first differential cell data signal propagating between the first interface and the first transformer.

15. The method according to claim 1, further comprising electrically connecting both the first interface and the second interface to the local ground terminal.

16. The method according to claim 1, wherein the differential terminals include a first differential terminal and a second differential terminal, and the method further comprises capacitively decoupling both the first differential terminal and the second differential terminal to the local ground terminal via decoupling capacitors.

17. A battery management system (BMS) circuit, comprising:

a plurality of terminals configured to facilitate measurement of voltages of an electrical energy storage stack, wherein at least one of the terminals forms a local ground for the BMS circuit;

a first transformer comprising a first winding and a second winding, the first winding has a first center tap and the second winding has a second center tap;

a second transformer having a third winding and a fourth winding, the third winding has a third center tap and the fourth winding has a fourth center tap;

a first interface circuit comprising differential terminals connected to the second winding of the first transformer via a first set of DC block capacitors;

a second interface circuit comprising differential terminals connected to the fourth winding of the second transformer via a second set of DC block capacitors;

a common-mode coupling between local ground terminal and each of the second center tap and the fourth center tap via a conductive connection;

at least one first bypass capacitor connected between each of differential terminals of the first interface circuit and the local ground terminal;

at least one first bypass capacitor connected between each of differential terminals of the second interface circuit and the local ground terminal;

wherein the conductive connection is such that it establishes a low-impedance coupling between the respective center taps and the local ground terminal; and wherein the low-impedance coupling reduces parasitic voltage drop at the center tap caused by high-frequency common-mode noise current due to a noise signal transferred via parasitic capacitive coupling between windings of the first transformer and or the second transformer, thereby reducing interference caused by the noise signal in the differential cell data signals at the first interface and or the second interface.

18. The BMS circuit according to claim 17, wherein one of the DC block capacitors of the first set is configured to prevent DC signals from being passed from the first interface circuit to the first transformer.

19. The BMS circuit according to claim 17, wherein one of the DC block capacitors of the second set is configured to prevent DC signals from being passed from the second interface circuit to the second transformer.

* * * * *